(12) United States Patent
Yamagata et al.

(10) Patent No.: US 8,657,456 B2
(45) Date of Patent: Feb. 25, 2014

(54) DISPLAY DEVICE AND METHOD FOR MANUFACTURING THE SAME

(75) Inventors: Yusuke Yamagata, Tokyo (JP); Naoki Nakagawa, Tokyo (JP); Toshiaki Fujino, Tokyo (JP); Takanori Okumura, Tokyo (JP); Toshiyuki Yoneda, Tokyo (JP); Toru Kokogawa, Tokyo (JP); Kenji Arita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 55 days.

(21) Appl. No.: 13/259,204

(22) PCT Filed: Apr. 23, 2010

(86) PCT No.: PCT/JP2010/057223
§ 371 (c)(1),
(2), (4) Date: Sep. 23, 2011

(87) PCT Pub. No.: WO2010/125976
PCT Pub. Date: Nov. 4, 2010

(65) Prior Publication Data
US 2012/0020056 A1 Jan. 26, 2012

(30) Foreign Application Priority Data
Apr. 30, 2009 (JP) ................................. 2009-110659

(51) Int. Cl.
*G02F 1/13357* (2006.01)
(52) U.S. Cl.
USPC ............ 362/97.1; 362/97.2; 362/97.4; 349/58

(58) Field of Classification Search
USPC .......... 362/267, 58, 602, 97.1, 628, 629, 632, 362/633, 634, 97.2, 97.4; 349/58
See application file for complete search history.

(56) References Cited

U.S. PATENT DOCUMENTS

| | | | |
|---|---|---|---|
| 7,148,944 B2 | 12/2006 | Kinoshita et al. | |
| 7,369,209 B2 | 5/2008 | Kinoshita et al. | |
| 7,834,962 B2 * | 11/2010 | Satake et al. | .................. 349/110 |
| 7,927,440 B2 | 4/2011 | Matsuhira | |

(Continued)

FOREIGN PATENT DOCUMENTS

| | | |
|---|---|---|
| JP | 2-24630 | 1/1990 |
| JP | 4-81120 U | 7/1992 |

(Continued)

OTHER PUBLICATIONS

Machine Translation of JP 2008-309813 A.*

(Continued)

*Primary Examiner* — Diane Lee
*Assistant Examiner* — Naomi M Wolford
(74) *Attorney, Agent, or Firm* — Oblon, Spivak, McClelland, Maier & Neustadt, L.L.P.

(57) ABSTRACT

A display device where concentration of a stress in a display panel is suppressed, to allow improvement in display quality, reliability and the like. A display device includes a display panel, an adhesive layer and a supporting substrate. The adhesive layer is provided on the display panel. The supporting substrate is made up of a member previously provided with curved surfaces. The display panel is bonded onto the curved surface of the supporting substrate by the adhesive layer. The supporting substrate supports the display panel in a curved form along the curved surface.

16 Claims, 38 Drawing Sheets

(56) References Cited

U.S. PATENT DOCUMENTS

| | | | |
|---|---|---|---|
| 8,040,476 B2 * | 10/2011 | Nakahata et al. | 349/122 |
| 2003/0134488 A1 | 7/2003 | Yamazaki et al. | |
| 2006/0142412 A1 | 6/2006 | Yamaoka et al. | |
| 2009/0015747 A1 * | 1/2009 | Nishizawa et al. | 349/58 |
| 2009/0033852 A1 * | 2/2009 | Fukuda et al. | 349/122 |
| 2009/0038734 A1 | 2/2009 | Matsuhira | |
| 2009/0059563 A1 * | 3/2009 | Takata et al. | 362/97.1 |
| 2009/0161048 A1 * | 6/2009 | Satake et al. | 349/110 |
| 2009/0290113 A1 * | 11/2009 | Nakahata et al. | 349/138 |
| 2010/0253647 A1 | 10/2010 | Agari et al. | |
| 2010/0289983 A1 * | 11/2010 | Rocard et al. | 349/62 |
| 2010/0296027 A1 | 11/2010 | Matsuhira et al. | |

FOREIGN PATENT DOCUMENTS

| | | |
|---|---|---|
| JP | 6-160820 | 6/1994 |
| JP | 10-268268 | 10/1998 |
| JP | 11-38395 | 2/1999 |
| JP | 11-327448 | 11/1999 |
| JP | 2000-199891 | 7/2000 |
| JP | 2005-22365 | 1/2005 |
| JP | 2005-91873 | 4/2005 |
| JP | 2006-58753 A | 3/2006 |
| JP | 2006-106079 A | 4/2006 |
| JP | 2007-272107 | 10/2007 |
| JP | 4104489 | 4/2008 |
| JP | 4125195 | 5/2008 |
| JP | 2008-309813 | 12/2008 |
| JP | 2008-309813 A | 12/2008 |
| JP | 2009-229667 | 10/2009 |
| JP | 2010-9017 | 1/2010 |
| WO | WO 2007/063818 A1 | 6/2007 |
| WO | WO 2008/047785 A1 | 4/2008 |
| WO | WO 2009/063817 A1 | 5/2009 |

OTHER PUBLICATIONS

Machine Translation of JP 2005-091873 A.*
Machine Translation of JP 06-160820 A.*
Machine Translation of JP 10-268268 A.*
International Preliminary Report on Patentability issued Nov. 10, 2011, in PCT/JP2010/057223 (English-language translation only).
Written Opinion of the International Searching Authority issued Jun. 8, 2010, in PCT/JP2010/057223 (with English-language translation).
International Search Report issued Jun. 8, 2010, in PCT/JP2010/057223.
Japanese Office Action Issued Nov. 6, 2012 in Patent Application No. 2011-511380 (with English translation).
German Office Action issued Feb. 14, 2013 in Patent Application No. 11 2010 001 807.3 with Partial English Translation.

* cited by examiner

F I G . 5
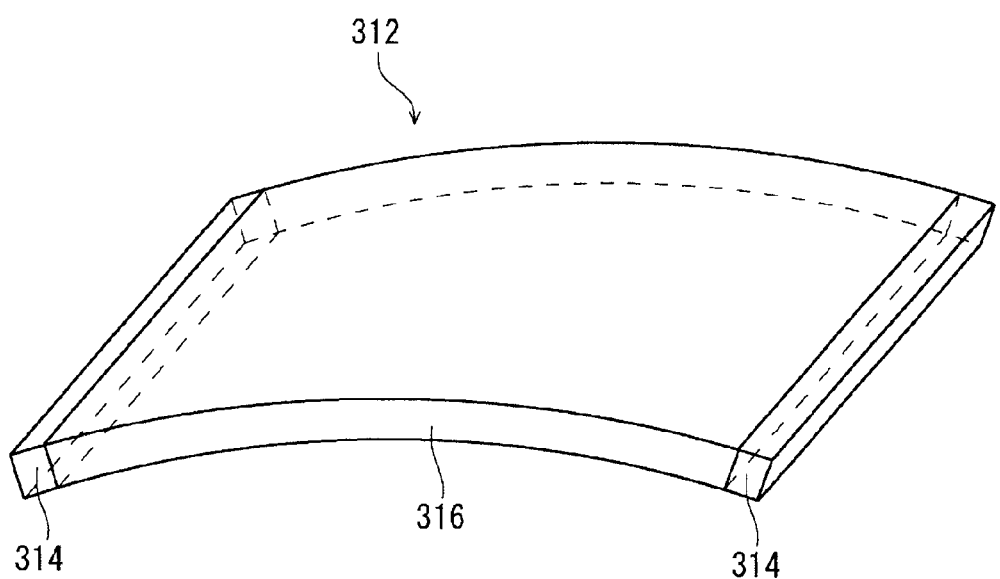

F I G . 7
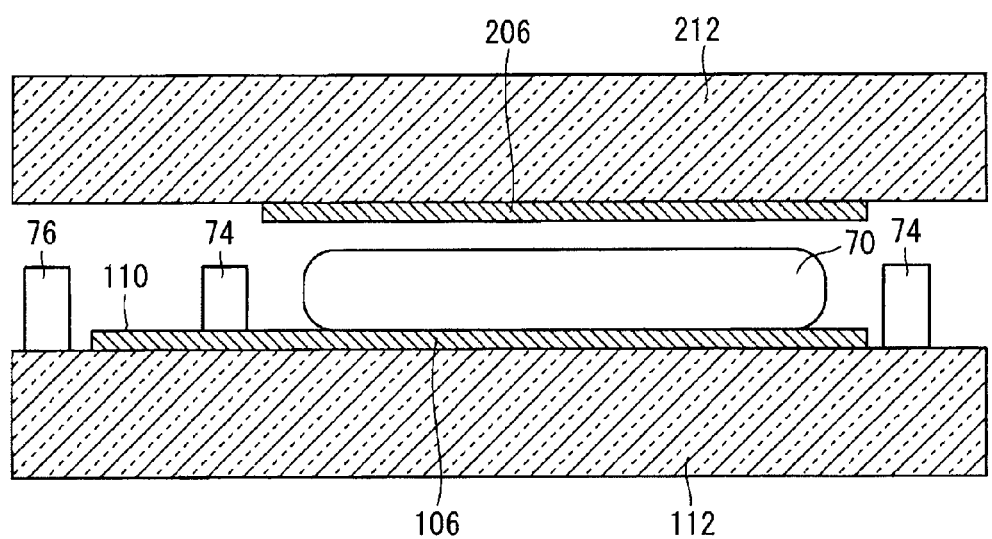

F I G . 8
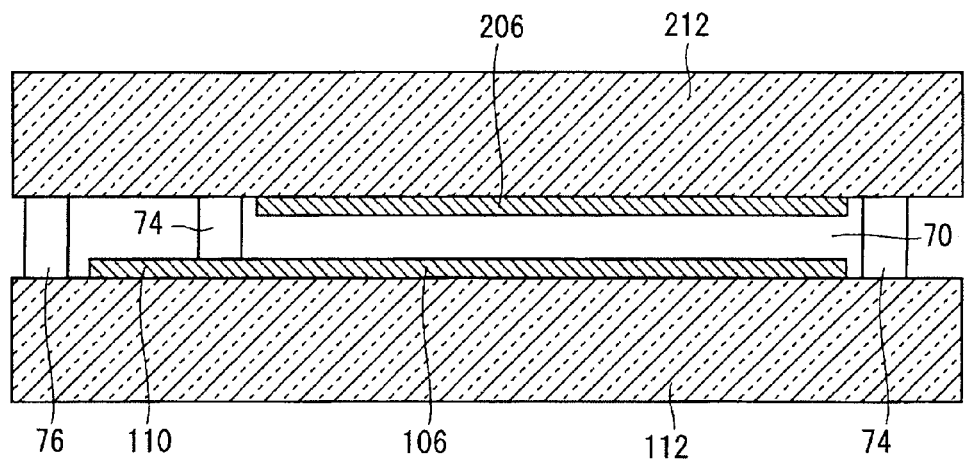

F I G . 9
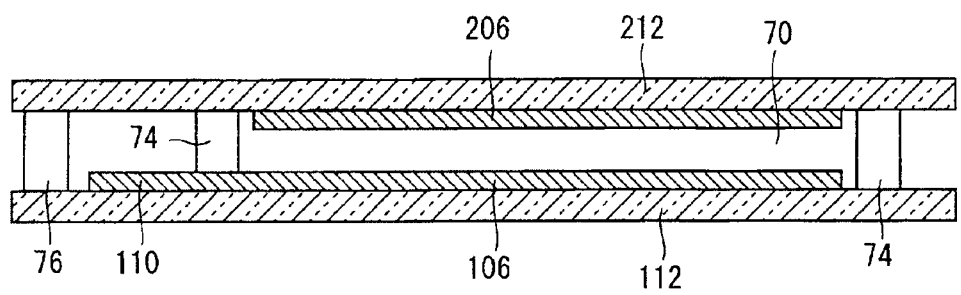

F I G . 1 3
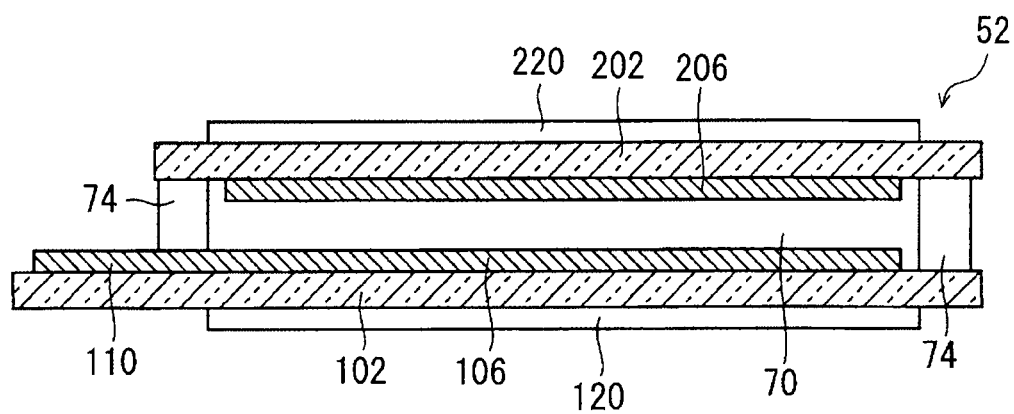

F I G . 1 8
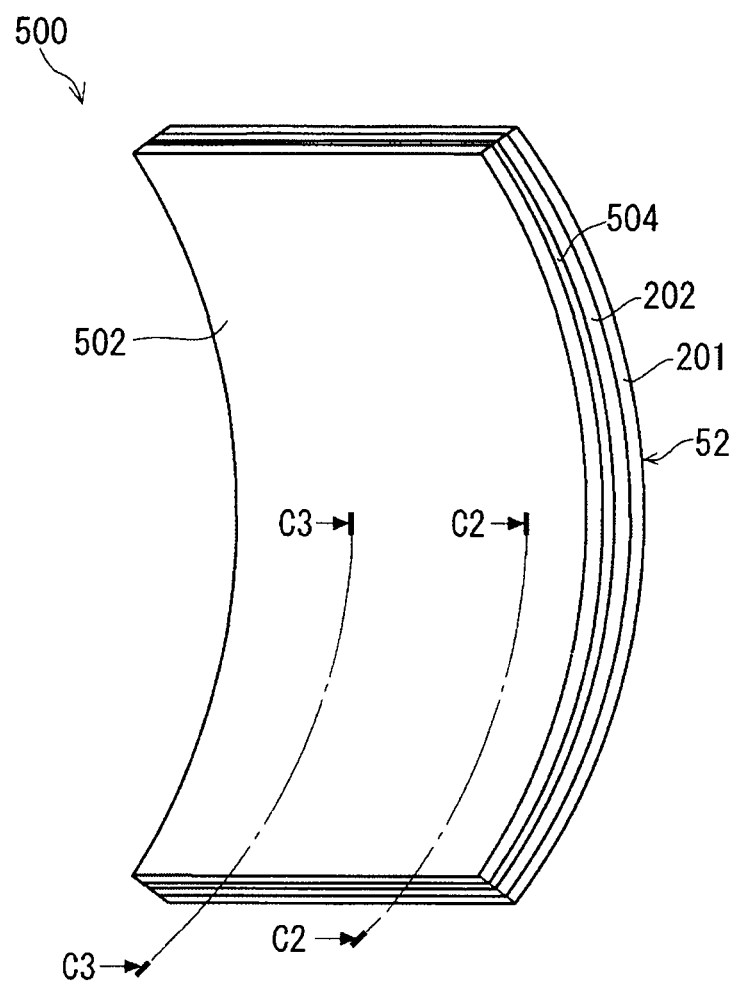

DISPLAY DEVICE AND METHOD FOR MANUFACTURING THE SAME

TECHNICAL FIELD

The present invention relates to a display device and a method for manufacturing the same, and particularly relates to a technique for promoting improvement in display quality, reliability and the like with regard to a display device having a curved display screen.

BACKGROUND ART

Planar display devices, represented by a liquid crystal display (LCD) device (LCD), have been utilized in a variety of fields through use of their characteristics of being light-weight, small in thickness and low in consumption power. Among them, liquid crystal display devices are in wide use for information equipment and AV equipment represented by a personal computer and a television.

Further, display devices where a self-light-emitting element is used for a displaying part, such as an electroluminescence-type electroluminescence (EL) display device and electronic paper making use of reflected light, have come to be used as next-generation thin display devices. The EL display device has characteristics such as a wide viewing angle, a high contrast, and rapid responses adaptable to moving images. The electronic paper is characterized by low power consumption which is obtained due to its memory function and reflective performance.

It has hitherto been required for such display devices to have reduced thickness and weight. Further, for example in the case of being mounted in a train, a car and the like, it is required to display a large amount of information with high efficiency and visibility in a limited space. Moreover, it is required to be fitted for a design of mounting equipment or an installation location.

In response to such requirements, studies and developments have been conducted on a curved display obtained by forming a display surface into a curved form so as to be integrated with an external form of a casing.

Realization of the display in a curved form requires the substrate of the display panel to have flexibility. As an example of such a substrate, for example, a plastic substrate (i.e. resin substrate) is known. In the case of a liquid crystal display, for example, an active element (TFT etc.), wiring and the like are formed on one resin substrate, and a color filter, a black matrix and the like are formed on the other resin substrate. For formation of these various elements, there are adapted a film formation step of forming a metal thin film and a semiconductor layer, and a photolithography step of forming a fine pattern. However, with these steps including a heating step at not lower than 200° C., a chemical treatment step and the like, heat resistance, expansion and shrinkage of the resin substrate become problems.

Meanwhile, a glass substrate has been widely used for the liquid crystal display and the like. The glass substrate has a small expansion coefficient, and excellent heat resistance and chemical resistance. However, the glass substrate has a problem of being hard and apt to break, and has thus been regarded as inappropriate for the display in the curved form. As opposed to this, it is proposed that a glass substrate with a thickness not larger than the degree of 0.2 mm can be made flexible and curved (cf. Japanese Patent Application Laid-Open No. 2004-46115). It is to be noted that a typical thickness of the glass substrate used for the liquid crystal display is, for example, from 0.5 to 1.0 mm.

SUMMARY OF THE INVENTION

Problems to be Solved by the Invention

While care should generally be taken with cracking and damage in handling the glass substrate, further greater care should be exercised in the case of curving a thin glass substrate. This is because in the curved thin glass substrate, an initial fracture tends to occur due to a crack or the like, and a delayed fracture tends to occur due to deterioration with time in portion of the crack or the like. This is attributed to continued application of a stress of tension or compression due to curving, in addition to the small thickness of the glass substrate.

On this account, it is required, for example, to cut the glass substrate so as to prevent occurrence of a crack and the like in a substrate cutting step, and also to prevent occurrence of a new crack on the cut surface in a subsequent variety of steps.

Further, a panel retentive structure and a panel protective structure are required to be formed such that unnecessary stress and distortion are not applied to the display panel for preventing expansion of the crack. The panel retentive structure is required to retain the display panel in a curved state against an elastic force of the display panel itself intending to return to the plain form.

In response to the above variety of requirements, there has been adopted a method for bonding a transparent protective substrate made of acryl or the like to each surface or one surface of the thinned panel, and subsequently processing them into the curved form.

However, it has been found that this processing method induces stress concentration on the display panel due to curving, to cause deterioration in fracture strength of the panel. Further, it has been found that in the case of the whole display region being not formed in a uniform curved form due to stress concentration, namely stress deviation, display unevenness occurs.

It is an object of the present invention to provide a display device where concentration of a stress in a curved display panel is suppressed, to allow improvement in display quality, reliability and the like, and also to provide a manufacturing method for manufacturing such a display device.

Means for Solving the Problem

A display device according to the present invention includes a display panel, an adhesive layer provided on the display panel, and a supporting substrate, which is made up of a member previously provided with curved surfaces, and onto the curved surface of which the display panel is bonded by the adhesive layer, to support the display panel in a curved form along the curved surface.

Effects of the Invention

In the above configuration, the display panel is bonded to the curved surface previously provided on the supporting substrate. This can suppress local concentration of a stress in the display panel, as compared with the display device obtained by bonding the display panel and a plate member to each other and then curving them. Since the stress concentration induces deterioration in display quality and the like, according to the above configuration, it is possible to provide a display device with high display quality.

Further, since the stress concentration induces deterioration in mechanical strength, according to the above configuration, it is possible to obtain high mechanical strength. Moreover, since the supporting substrate protects the display panel from an external force, it is possible to obtain high protectivity and durability. It is therefore possible to provide a display device with high reliability.

BRIEF DESCRIPTION OF THE DRAWINGS

FIG. 5 is a perspective view explaining a back light module of the display device according to Embodiment 1.

FIG. 7 is a sectional view explaining the manufacturing process for the display device according to Embodiment 1.

FIG. 8 is a sectional view explaining the manufacturing process for the display device according to Embodiment 1.

FIG. 9 is a sectional view explaining the manufacturing process for the display device according to Embodiment 1.

FIG. 13 is a sectional view explaining the manufacturing process for the display device according to Embodiment 1.

FIG. 18 is a perspective view explaining a display device for comparison;

EMBODIMENT FOR CARRYING OUT THE INVENTION

Embodiment 1

Figure 1:
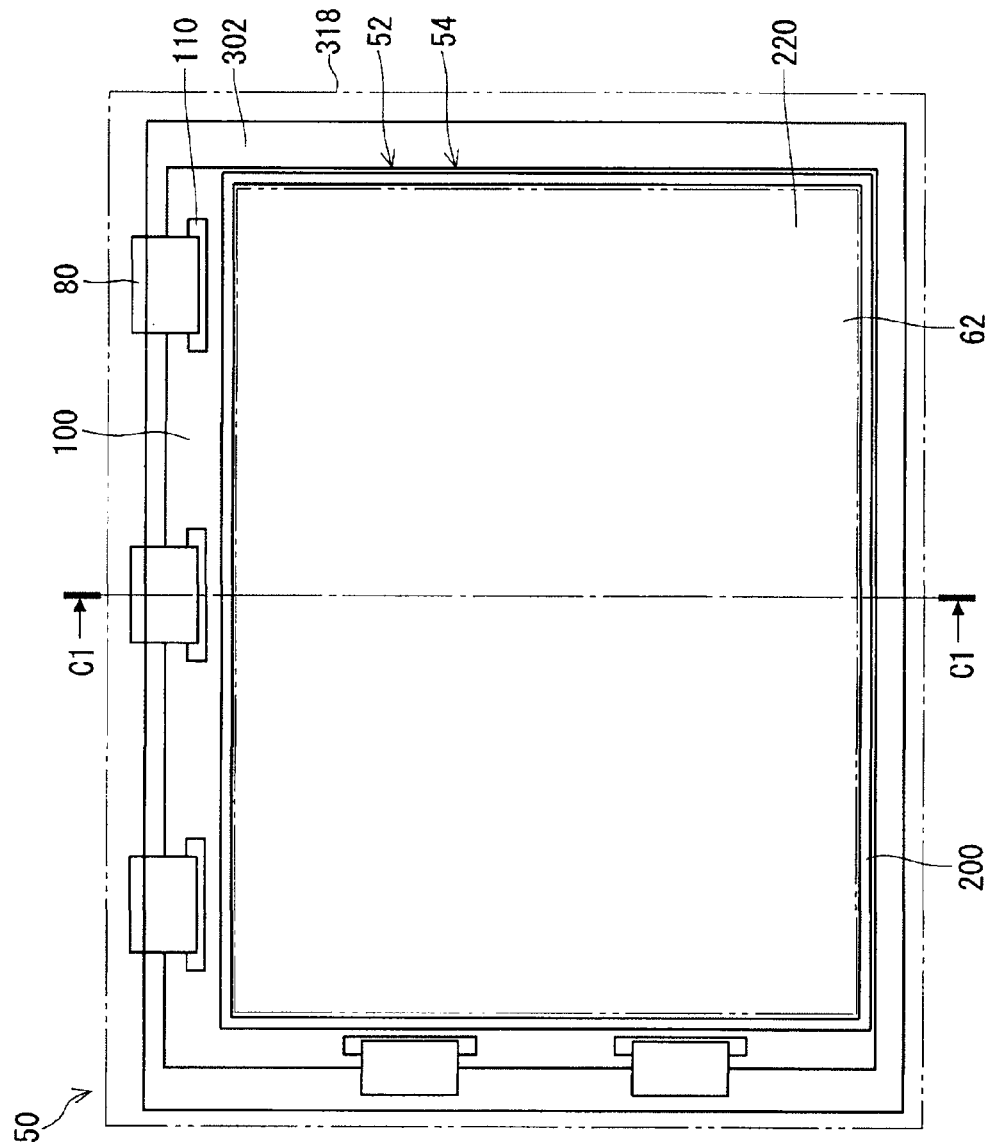
FIG. 1 is a plan view explaining a display device according to Embodiment 1.
Figure 2:
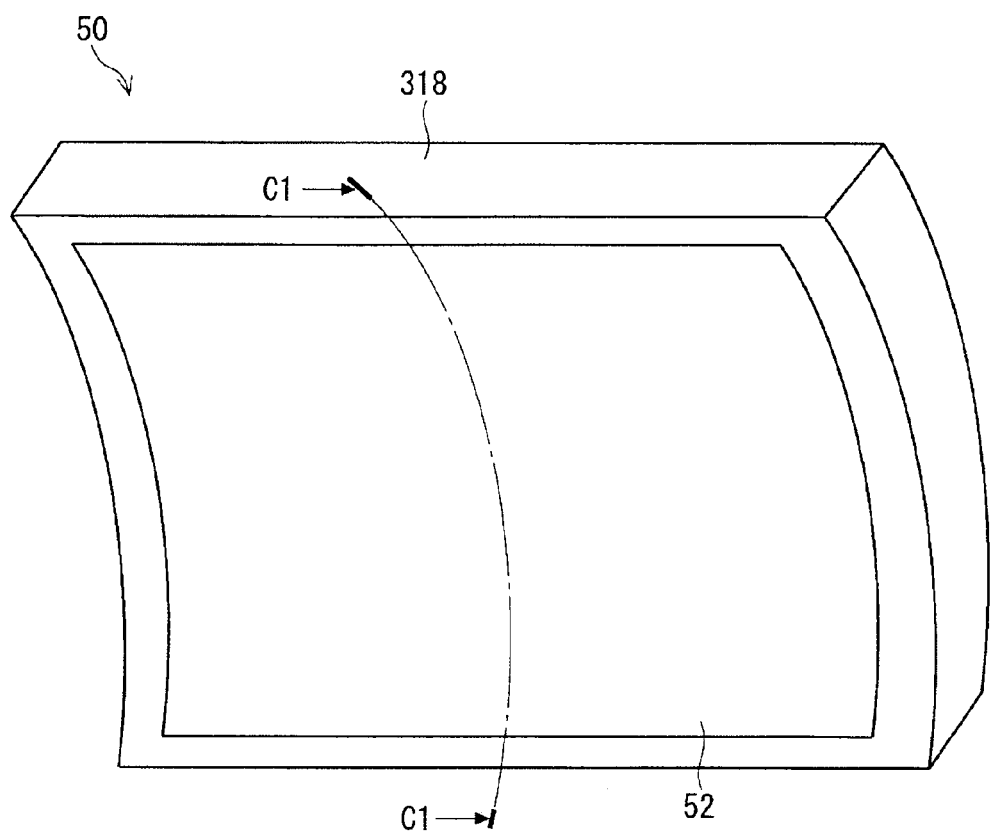
FIG. 2 is a perspective view explaining the display device according to Embodiment 1.
Figure 3:
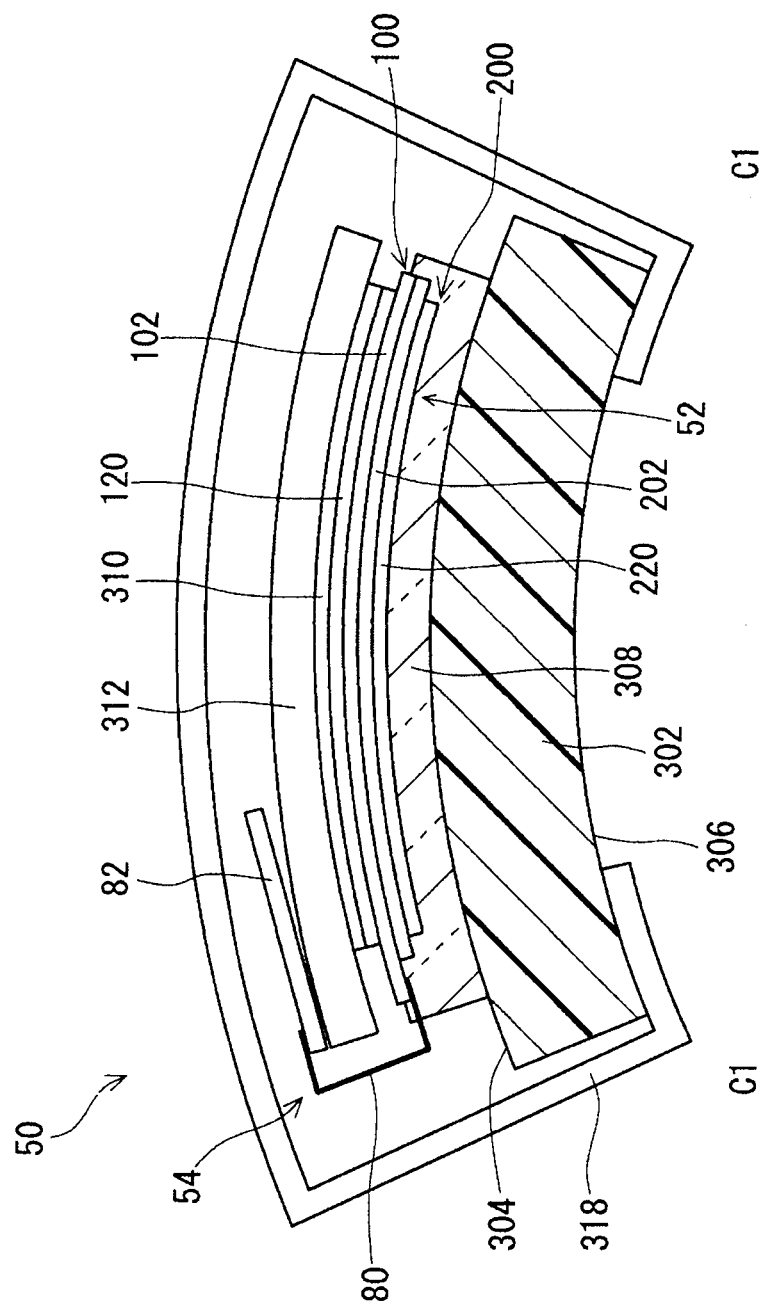
FIG. 3 is a sectional view along a line C1-C1 in FIGS. 1 and 2.

FIGS. 1 to 3 exemplify a liquid crystal display device 50 as an example of a display device according to Embodiment 1 of the present invention. FIG. 1 is a plan view, FIG. 2 is a perspective view and FIG. 3 is a sectional view along a line C1-C1 in FIGS. 1 and 2. Further, FIG. 4 exemplifies a sectional view of a liquid crystal panel 52 provided in the liquid crystal display device 50. It is to be noted that in FIGS. 3 and 4, hatching is provided for making the drawings easy to understand to such a degree as not to make the drawings complicated. This also applies to subsequent drawings.

In addition, although an example of a TN (Twisted Nematic) type is herein cited as the liquid crystal display device 50, it is also possible to transform the liquid crystal display device 50 to another structure of the TN type, and it is also possible to configure the liquid crystal display device 50 with a structure different from the TN type (e.g. FFS (Fringe Field Switching) type, IPS (In-Plane Switching) type, etc.). Further, although a case is exemplified where the liquid crystal display device 50 is a color display type, it can also be transformed into a monochromatic display type. Moreover, although the case of the liquid crystal display device 50 being a transparent type or a semi-transparent type is exemplified, it can also be transformed into a reflective type.

Figure 4:
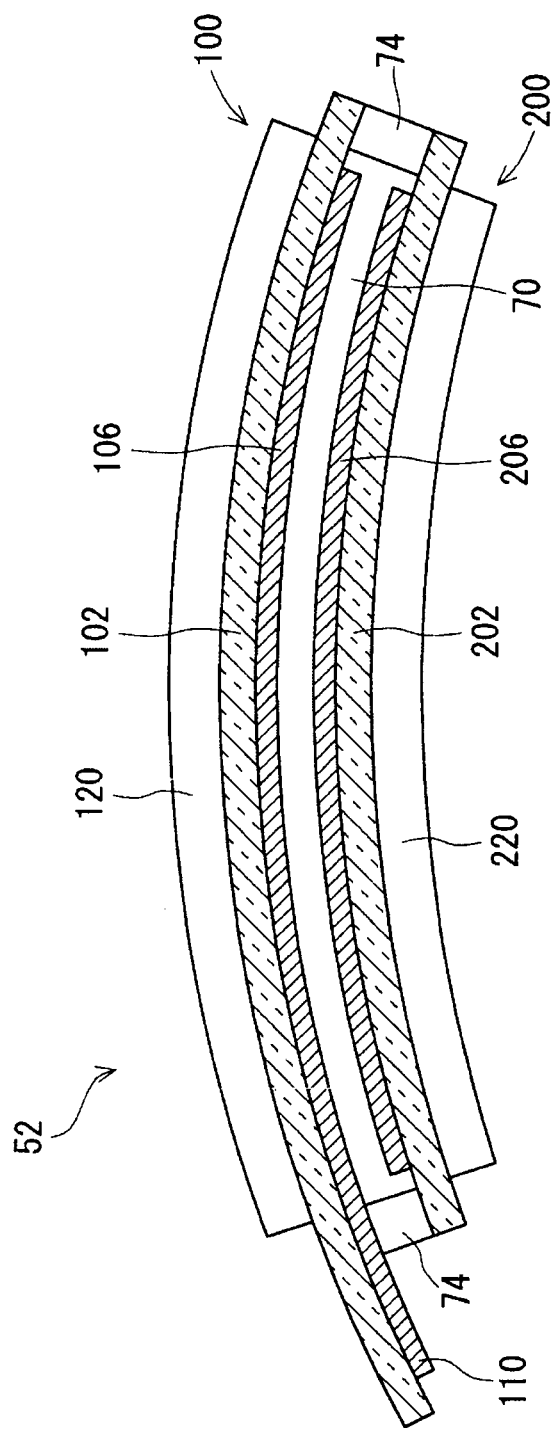
FIG. 4 is a sectional view explaining a display panel of the display device according to Embodiment 1.

First, the liquid crystal panel 52 is described with reference to FIG. 4. The exemplified liquid crystal panel 52 includes a pair of insulating substrates 102, 202, liquid crystal (or liquid crystal layer) 70, and a seal 74.

Each of the insulating substrates 102, 202 is, for example, made up of a glass plate with a thickness of about 0.1 to 0.2 mm. In the liquid crystal panel 52 of the transparent type or the semi-transparent type, each of the insulating substrates 102, 202 is made up of a transparent material, whereas in the case of the reflective type, a substrate not constituting the display surface out of the insulating substrates 102, 202, namely a substrate to be on the back surface side (i.e. rear surface side) may not be transparent.

The insulating substrates 102, 202 are arranged with main surfaces thereof opposed to each other (made to face each other), and for example, 3 to 10 μm of a gap is provided between both insulating substrates 102 and 202. The insulating substrate 102 is larger than the insulating substrate 202, and hence with both substrates 102, 202 in the state of being arranged as opposed to each other, the insulating substrate 102 has a portion protruding from the insulating substrate 202.

The liquid crystal 70 is arranged between the insulating substrates 102 and 202. The seal 74 is arranged between the insulating substrates 102, 202, to adhere and fix both insulating substrates 102, 202 to each other. The seal 74 is arranged along peripheries of the insulating substrates 102, 202, to have a form surrounding the liquid crystal layer 70. Therefore, the liquid crystal 70 is accommodated in a container made up of the insulating substrates 102, 202 and the seal 74.

In a view of the main surfaces of the insulating substrates 102, 202 seen from the top, a pixel area (or display area) 62 where an image is displayed is provided inside a region arranged with the liquid crystal layer 70. A large number of pixels are formed in matrix in the pixel area 62. For example when a screen size is 14 inches (diagonal length is about 36 cm) and a display standard is VGA (Video Graphic Array), about 920 thousands (≈640×480×3) of pixels are arrayed in matrix in the pixel area 62.

The liquid crystal panel 52 further includes an active element part 106 and an external wiring connecting terminal 110. These elements 106, 110 are arranged on the inner surface side of the insulating substrate 102, namely the side of the opposed insulating substrate 202.

The active element part 106 includes a variety of elements for driving each pixel, such as an active element (TFT, etc.), a pixel electrode, a capacitative element, and wiring. The active element part 106 is arranged in the pixel area 62. The external wiring connecting terminal 110 is arranged in the portion where the insulating substrate 102 protrudes from the insulating substrate 202 (portion not overlapped with the insulating substrate 202). It is to be noted that the active element part 106 and the external wiring connecting terminal 110 are connected with each other through lead-out wiring, and the lead-out wiring is present in an extended manner across the seal 74.

The liquid crystal panel 52 further includes a color filter/electrode part 206 having a laminated structure of a color filter and an electrode (common electrode). The color filter/electrode part 206 is arranged on the inner surface side of the insulating substrate 202, namely the side of the opposed insulating substrate 102. Further, the color filter/electrode part 206 is arranged in the pixel area 62, and opposed to the active element part 106 via the liquid crystal layer 70.

The liquid crystal display device 50 further includes polarization plates 120, 220. The polarization plate 120 is arranged on the outer surface side of the insulating substrate 102, namely the opposite side to the insulating substrate 202 paired therewith. On the other hand, the polarization plate 220 is arranged on the outer surface side of the insulating substrate 202, namely the opposite side to the insulating substrate 102 paired therewith. Therefore, polarization plates 120, 220 are opposed to each other via the insulating substrate 102, the active element part 106, the liquid crystal layer 70, the color filter/electrode part 206 and the insulating substrate 202. Further, the polarization plates 120, 220 are arranged so as to include the pixel area 62.

It should be noted that in FIG. 3 and the like, the liquid crystal panel 52 is illustrated in a simple manner by means of the insulating substrates 102, 202 and the polarization plates 120, 220.

As exemplified in FIG. 3, the liquid crystal display device 50 further includes external wiring 80 and a control substrate 82. The external wiring 80 is, for example, made up of a flexible cable, and connected to the external wiring connecting terminal 110. The control substrate 82 has a circuit to drive the active element part 106, and the like, and is connected to the external wiring connecting terminal 110 via the external wiring 80. With such a configuration, an electric signal and the like are transmitted from the control substrate 82 to the active element part 106 via the external wiring 80, the external wiring connecting terminal 110 and the lead-out wiring.

Herein, a structure including the insulating substrate 102, the active element part 106, the lead-out wiring, the external wiring connecting terminal 110 and the polarization plate 120 is referred to as an array substrate 100. Further, a structure including the insulating substrate 202, the color filter/electrode part 206 and the polarization plate 220 is referred to as a color filter substrate 200. It should be noted that the array substrate may be referred to as an element substrate or the like, and a color filter substrate may be referred to as an opposed substrate or the like.

Further, although the case is herein exemplified where the liquid crystal panel 52 is configured including the array substrate 100, the color filter substrate 200, the liquid crystal layer 70 and the seal 74, there is for example a case where a configuration obtained by further including the external wiring 80 in the liquid crystal panel 52 with the above configuration is referred to as the liquid crystal panel.

Moreover, a structure including the liquid crystal panel 52, the external wiring 80 and the control substrate 82, namely a base unit structure configured so as to be capable of controlling a display operation of the liquid crystal panel 52, is referred to as a body module 54.

The exemplified liquid crystal display device 50 has a structure where contents displayed on the liquid crystal panel 52 are seen by a user from the color filter substrate 200 side. In other words, the color filter substrate 200 constitutes the display surface. It should be noted that in this case, the array substrate 100 is referred to as a rear surface.

The liquid crystal display device 50 further includes a supporting substrate 302 and an adhesive layer 308 on the color filter substrate 200 side outside the liquid crystal panel 52. More specifically, the adhesive layer 308 is provided on the liquid crystal panel 52, and the supporting substrate 302 is provided on the adhesive layer 308. Thereby, the supporting substrate 302 is made to adhere to the liquid crystal panel 52 by the adhesive layer 308, to support the liquid crystal panel 52.

The supporting substrate 302 is made up of a plate-like member whose opposed main surfaces 304, 306 are curved, and one curved surface 304 constitutes a convex surface of the supporting substrate 302 while the other curved surface 306 constitutes a concave surface of the supporting substrate 302. It should be noted that in this case, a center of curvature of each of the curved surfaces 304, 306 is located on the concave surface 306 side.

Herein exemplified is the case of the curved surfaces 304, 306 having the same curved-surface form, such as the case of the curved surfaces 304, 306 having the same center of curvature. Further exemplified is a case where a distance between the curved surfaces 304 and 306 is uniform, namely a case where a whole thickness of the plate-like member constituting a supporting member 302 is uniform. In such a case, the curved surfaces 304, 306 are in the relation of overlapping with each other by parallel movement.

In the examples of FIGS. 1 to 3, short sides of the curved surfaces 304, 306, namely short sides of the supporting member 302, are curved, while long sides of the curved surfaces 304, 306, namely long sides of the supporting member 302, are not curved but have linear forms. In addition, with regard to the supporting substrate 302 and the like, the side which is curved is referred to as a curved side, and the side which is not curved is referred to as a non-curved side or a linear side.

As is apparent in a later-mentioned manufacturing method, the supporting substrate 302 is already curved before bonded to the liquid crystal panel 52, and previously has the convex surface 304 and the concave surface 306. The curved form of the supporting substrate 302 can be formed for example by a technique such as bending process on a plate-like member, cutting and grinding process or injection molding.

The supporting substrate 302 has higher stiffness than the liquid crystal panel 52, and is configured so as to be difficult to transform as compared with the liquid crystal panel 52. It is considered that the insulating substrates 102, 202 most contribute to the stiffness of the liquid crystal panel 52 among the constitutional elements of the liquid crystal panel 52. In view of such a respect, it is also possible to grasp that the supporting substrate 302 has higher stiffness than the insulating substrates 102, 202.

Such stiffness can be provided for example by adjustment of the thickness. For example when the glass substrates constituting the insulating substrates 102, 202 have thicknesses of the order of 0.1 to 0.2 mm, the supporting substrate 302 can be made up of an acrylic substrate or a polycarbonate substrate having a thickness of not smaller than 3.0 mm.

In this case, the supporting substrate 302 has a larger thickness than the liquid crystal panel 52. When the insulating substrates 102, 202 have thicknesses of the order of 0.1 to 0.2 mm, the liquid crystal panel 52 has a thickness of the order of 0.7 to 0.8 mm. In addition, among the constitutional elements of the liquid crystal panel 52, the thicknesses of the insulating substrates 102, 202 and the polarization plates 120, 220 most contribute to the thickness of the liquid crystal panel 52. For this reason, the thickness of the liquid crystal panel 52 is almost equal to a total of the thicknesses of the insulating substrates 102, 202 and the thicknesses of the polarization plates 120, 220.

In the liquid crystal display device 50, the supporting substrate 302 is arranged with the convex surface 304 opposed to the polarization plate 220 of the color filter substrate 200.

In this case, the supporting substrate 302 is arranged on the display surface side of the liquid crystal panel 52, and contents displayed on the liquid crystal panel 52 are seen through the supporting substrate 302. The supporting substrate 302 is thus made up of a transparent material. The transparent supporting substrate 302 can be made up of an acrylic or polycarbonate resin as exemplified above.

Herein, a case is exemplified where the adhesive layer 308 is made up of a transparent gel adhesive layer described in Japanese Patent Publication No. 4125195. According to Japanese Patent Publication No. 4125195, this transparent gel adhesive layer has excellent flexibility, buffer properties, adhesiveness and the like, thereby to facilitate realization of bonding without the need for high pressure and high temperature. Although the transparent gel adhesive layer described in Japanese Patent Publication No. 4125195 serves to bond an optical filter to a variety of display panels, the above characteristics are preferred for the adhesive layer 308 of the liquid crystal display device 50.

However, the adhesive layer 308 is not restricted to this, and a variety of materials having characteristics similar to the above transparent gel adhesive layer can be adopted. For example, instead of using the gel material, a molecular structure of a material, or the like, can be selected so as to provide flexibility and the like.

For example, a material such as a silicone adhesive, a synthetic rubber adhesive, an acrylic adhesive, an olefin adhesive or an epoxy adhesive can be used as the adhesive layer 308 so long as being a material with flexibility.

It is to be noted that as a commercial product, for example, an adhesive sheet such as a product named "CLEARFIT (trademark)" manufactured by Mitsubishi Plastics, Inc. can be applied to the adhesive layer 308.

The above exemplified adhesive layer constituting the adhesive layer 308 has a gel form formed by expansion of a three-dimensional cross-linked polymer in a liquid containing a plasticizer and inorganic particulates. Further, the gel adhesive layer has desired adhesibility, retentivity, buffer power, flexibility, and the like at room temperature. The gel adhesive layer can be provided as a sheet-like member. This can facilitate formation of the adhesive layer 308 by so-called roller crimping system at room temperature. Further, the exemplified gel adhesive layer can form the adhesive layer 308 to be transparent, and is thus preferred for the adhesive layer 308 provided on the display surface side of the liquid crystal panel 52.

The adhesive layer 308 is provided between the liquid crystal panel 52 and the convex surface 304 of the supporting substrate 302 on the color filter substrate 200 side.

The adhesive layer 308 between the polarization plate 220 and the supporting substrate 302 extends with a uniform thickness. Hence the liquid crystal panel 52 is formed in the curved form along the convex surface 304 of the supporting substrate 302, and supported by the supporting substrate 302. That is, in the liquid crystal display device 50, the color filter substrate 200 corresponding to the display surface is curved in a concave form.

It is to be noted that at this time, the array substrate 100 on the rear surface side is curved in a convex form, and the liquid crystal panel 52 as a whole is curved so as to have a center of curvature on the color filter substrate 200 side as seen from the liquid crystal layer 70.

In the examples of FIGS. 1 to 4, short sides of the liquid crystal panel 52, namely short sides of the insulating substrates 102, 202, constitute curved sides, while long sides of the liquid crystal panel 52, namely long sides of the insulating substrates 102, 202, constitute non-curved sides.

In the illustrated example, the adhesive layer 308 is also present in an extended manner outside the polarization plate 220, and covers a connected area between the external wiring connecting terminal 110 and the external wiring 80.

Further, in the illustrated example, the adhesive layer 308 is present in an extended manner further beyond the liquid crystal panel 52. Herein, a case is exemplified where the adhesive layer 308 is present in an extended manner beyond the liquid crystal panel 52 all around the liquid crystal panel 52. In this case, the adhesive layer 308 is provided in a wider range than the liquid crystal panel 52. In the adhesive layer 308, a preferable width of the portion protruding from the liquid crystal panel 52 is, for example, not smaller than 5.0 mm. However, the adhesive layer 308 is within a range on the convex surface 304 of the supporting substrate 302.

Moreover, in the illustrated example, the portion protruding from the liquid crystal panel 52 in the adhesive layer 308 is present in an extended manner on the end surfaces of the insulating substrates 102, 202, namely the end surface of the liquid crystal panel 52. With such a form, it is possible to prevent occurrence of peeling between the liquid crystal panel 52 and the supporting substrate 302 from the end of the panel. This allows more reliable adherence between the liquid crystal panel 52 and the supporting substrate 302. It is thereby possible to obtain high reliability.

According to the above arrangement form, the adhesive layer 308 has a form where the portion opposed to the polarization plate 220 is depressed, as compared with a portion outside the polarization plate 220. In this case, it is possible to express that the liquid crystal panel 52 is in the form of the color filter substrate 200 side being pressed into, or sunk into, the adhesive layer 308. It is to be noted that in the illustrated example, the adhesive layer 308 has not reached the polarization plate 120 of the array substrate 100, and the whole of the liquid crystal panel 52 has not come into the state of being buried in the adhesive layer 308.

The adhesive layer 308 is preferably formed to have a thickness of the order of 1 mm with respect to the liquid crystal panel 52 having a thickness of the order of 0.7 to 0.8 mm. With such a thickness, it is possible to press the liquid crystal panel 52 into the adhesive layer 308 to such a degree that the adhesive layer 308 reaches the end surface of the liquid crystal panel 52. That is, when the adhesive layer 308 has an excessively small thickness, the end surface of the liquid crystal panel 52 is not covered by the adhesive layer 308, making peeling more likely to occur. In addition, when the adhesive layer 308 has an excessively large thickness, it may be difficult to retain the liquid crystal panel 52 depending on the flexibility of the adhesive layer 308.

It should be noted that the portion protruding from the liquid crystal panel 52, namely the portion with the largest thickness in the adhesive layer 308 having been formed into the concave form by the bonding of the liquid crystal panel 52, has a thickness almost held to be the initial thickness of 1 mm.

The liquid crystal display device 50 further includes a diffusion sheet 310 and a back light module 312 on the array substrate 100 side outside the liquid crystal panel 52. More specifically, on the rear surface side of the liquid crystal panel 52, the diffusion sheet 310 is arranged on the polarization plate 120 of the liquid crystal panel 52, and the back light module 312 is arranged on the diffusion sheet 310.

The back light module 312 is opposed to the liquid crystal panel 52 via the diffusion sheet 310, and applies a back light to the liquid crystal panel 52.

As an example of the back light module 312, a back light module of so-called edge-light system is described with reference to a perspective view of FIG. 5. It is to be noted that the back light module 312 is not restricted to such a system. The exemplified back light module 312 includes a light source 314, a light guide plate 316, an optical sheet (not illustrated) and a reflective plate (not illustrated).

The light guide plate 316 has a form along the curved form of the liquid crystal panel 52 (cf. FIG. 3), namely a form which are curved similarly to the curved surfaces 304, 306 of the supporting substrate 302 (cf. FIG. 3). For this reason, the back light module 312 also has the curved form. The back light module 312 is arranged as opposed to the liquid crystal panel 52, in the state of the light guide plate 316 being provided along the curved form of the liquid crystal panel 52.

The light source 314 is arranged as opposed to the end surface of the non-curved side of the light guide plate 316. In the example of FIG. 5, the light source 314 is provided on each of two non-curved sides. Although schematically illustrated in FIG. 5, the light source 314 can, for example, be made up of a linear light source present in an extended manner in parallel with the non-curved end surface of the light guide plate 316, a plurality of point light sources arrayed along the non-curved end surface, or the like. It is to be noted that examples of the linear light source include a cold-cathode tube, and examples of the point light source include an LED.

The non-illustrated optical sheet is arranged on the main surface of the light emission side of the light guide plate 316. The optical sheet is, for example, made up of one or a plurality of various optically functional sheets such as a prism sheet and a diffusion sheet. Moreover, the non-illustrated reflective plate is arranged on the main surface on the opposite side.

Although the curved back light module 312 is herein exemplified, a plate-like back light module 312 having a plate-like light guide plate 316 can also be adopted.

However, according to the curved back light module 312, a distance between the back light module 312 and the liquid crystal panel 52 can be made uniform all over the liquid crystal panel 52. This allows illumination all over the liquid crystal panel 52 with the same light amount. It is thereby possible to obtain high display quality.

Further, according to the curved back light module 312, the liquid crystal panel 52 can be supported in the curved form from the rear surface side. In this case, the liquid crystal panel 52 is sandwiched and retained in the curved form between the supporting substrate 302 and the back light module 312. This can prevent the liquid crystal panel 52 from returning to the plate form by an elastic force of its own.

Returning to FIG. 3, the diffusion sheet 310 is provided between the back light module 312 and the liquid crystal panel 52. As the diffusion sheet 310, the diffusion sheet in the back light module 312 may be employed, or separately from this, another sheet may be provided. It is to be noted that the diffusion sheet 310 is, for example, fixed to the liquid crystal panel 52 and tightly bonded to the rear surface of the liquid crystal panel 52 outside the display region.

With the diffusion sheet 310 interposed between the back light module 312 and the liquid crystal panel 52, direct contact therebetween is avoided. This can buffer collision between the back light module 312 and the liquid crystal panel 52 which occurs due, for example, to vibrations of some sort, or the like. It is therefore possible to prevent damage on the back light module 312 and the liquid crystal panel 52. Accordingly, it is possible to provide the liquid crystal display device 50 with high protection properties, durability and the like, namely the liquid crystal display device 50 with high reliability.

Supposedly in the case of not providing the diffusion sheet 310, when a nonuniform void is present between the back light module 312 and the liquid crystal panel 52, an interference fringe is observed on the display screen. As opposed to this, providing the diffusion sheet 310 can suppress such an interference fringe. It is thereby possible to obtain high display quality.

The liquid crystal display device 50 further includes a frame 318 that accommodates the above elements 54, 302, 308, 310, 312. The frame 318 has an opening, and the display surface of the liquid crystal panel 52 is turned to the opening. The elements 54, 302, 308, 310, 312 are fixed to the frame 318 in the stacked state as thus described with nonillustrated screws or the like. It is to be noted that the external wiring 80 is bent to rear surface side of the back light module 312, and the control substrate 82 is thereby arranged on the rear surface of the back light module 312.

It should be noted that in the exemplified liquid crystal display device 50, the insulating substrates 102, 202 and the supporting substrate 302 are curved so as to each have a center of curvature on the supporting substrate 302 side in the cross-sectional direction shown in FIG. 3. In other words, insulating substrates 102, 202 and the supporting substrate 302 each have such a form as to be formed for example by cutting a part of the side surface of a cylinder by a plane in parallel with a central axis of the cylinder.

Next, a manufacturing method for the liquid crystal display device 50 is described with reference to FIGS. 6 to 17. Herein, a manufacturing method for multi-work processing (or a plural-work processing) is exemplified.

Figure 6:
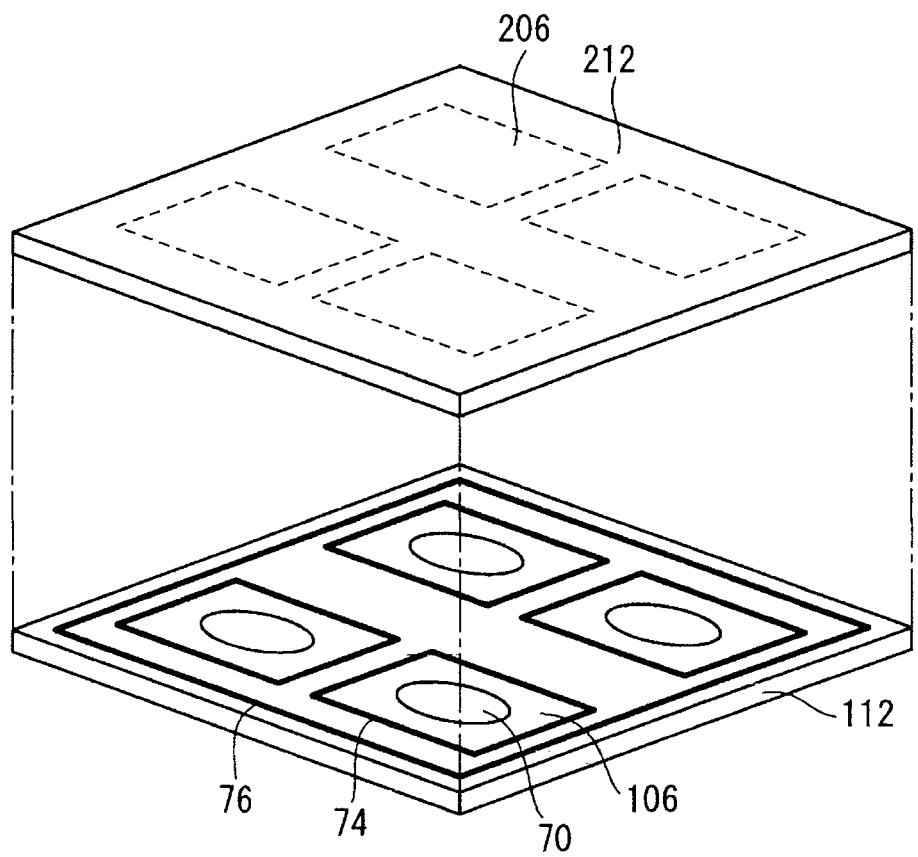
FIG. 6 is a perspective view explaining a manufacturing process for the display device according to Embodiment 1.

First, insulating substrates 112, 212, which are larger than the insulating substrates 102, 202 in the liquid crystal panel 52 and to become mother glass substrates, are prepared. Then, as shown in FIGS. 6 and 7, a plurality of active element parts 106 and the like are formed on the insulating substrate 112 corresponding to the insulating substrate 102, and a plurality of color filter/electrode parts 206 are formed on the insulating substrate 212 corresponding to the insulating substrate 202. In addition, FIG. 6 exemplifies the case of manufacturing four liquid crystal display devices 50 from large-sized insulating substrates 112, 212. Herein, the insulating substrates 112, 212 that are the mother glass substrates have larger thicknesses than the insulating substrates 102, 202, and are for example glass plates each having a thickness of 0.5 to 1.0 mm.

Next, as shown in FIG. 6, the seal 74 is applied in the form of a frame surrounding each active element part 106, and a dummy seal 76 is applied in the form of a frame surrounding all circumferences of the insulating substrate 112. As the seals 74, 76, there is used, for example, an epoxy adhesive of a thermal curing type that is cured by heating or a photo-curing type that is cured by irradiation with light such as ultraviolet rays, or the like. Although the case has been herein exemplified where both the seals 74, 76 are applied onto the insulating substrate 112, one or each of the seals 74, 76 may be applied onto the insulating substrate 212.

Next, as shown in FIGS. 6 and 7, the liquid crystal 70 is dropped into a region surrounded by the seal 74.

Then, as shown in FIG. 8, the insulating substrates 112, 212 are made opposed to each other, which are positioned and then bonded. The seals 74, 76 in the bonded state are cured to make both substrates 112, 212 adhere to each other. The adherence between the insulating substrates 112, 212 seals the liquid crystal 70 inside a space partitioned by the insulating substrates 112, 212 and the seal 74.

Although the case has been herein exemplified where the liquid crystal layer 70 is formed by drop filling method, the liquid crystal layer 70 may be formed by dipping-injection method, or the like.

Subsequently, as shown in FIG. 9, the insulating substrates 112, 212 are reduced to have thicknesses similar to the foregoing insulating substrates 102, 202. Such reduction in thickness of the substrate can be performed for example by chemical mechanical polishing, chemical etching, or the like. According to these methods, the substrate can be reduced to have a thickness as small as about 0.1 mm.

Figure 10:
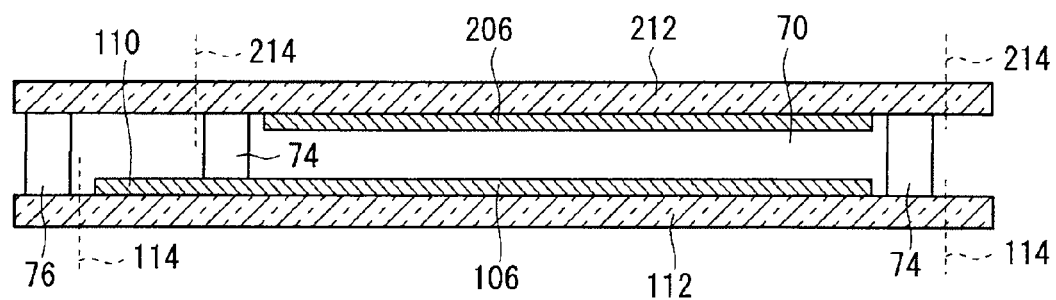
FIG. 10 is a sectional view explaining the manufacturing process for the display device according to Embodiment 1.
Figure 11:
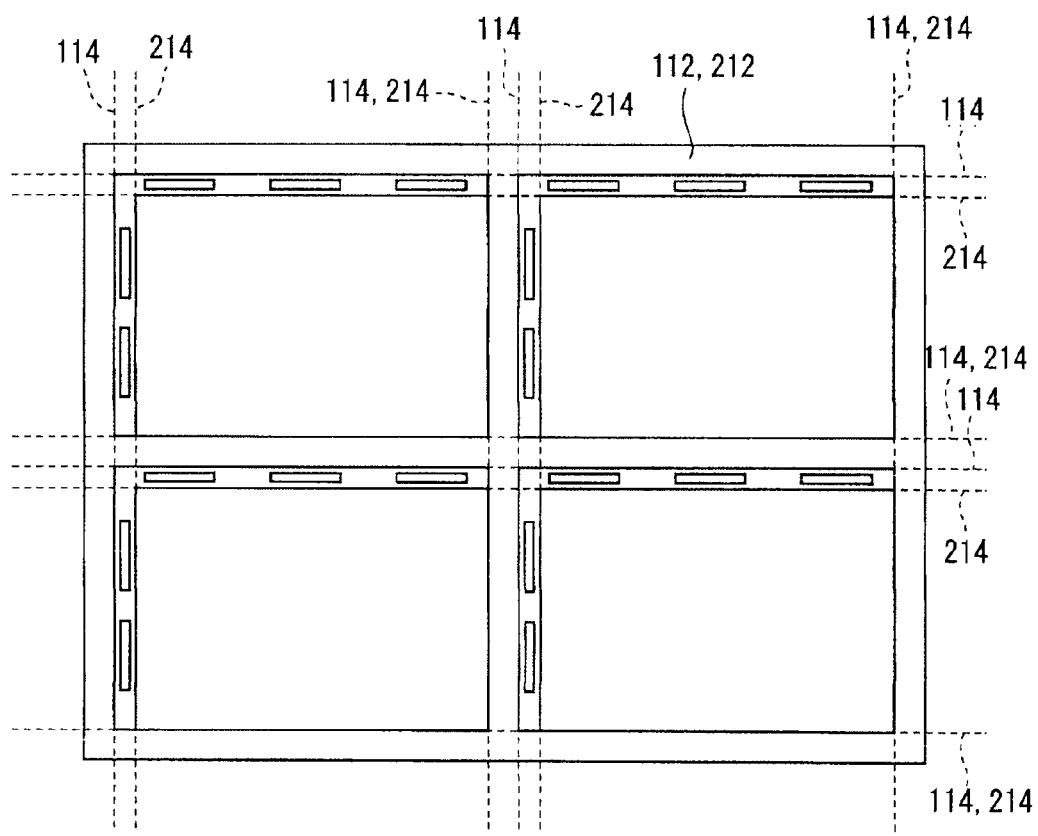
FIG. 11 is a plan view explaining the manufacturing process for the display device according to Embodiment 1.
Figure 12:
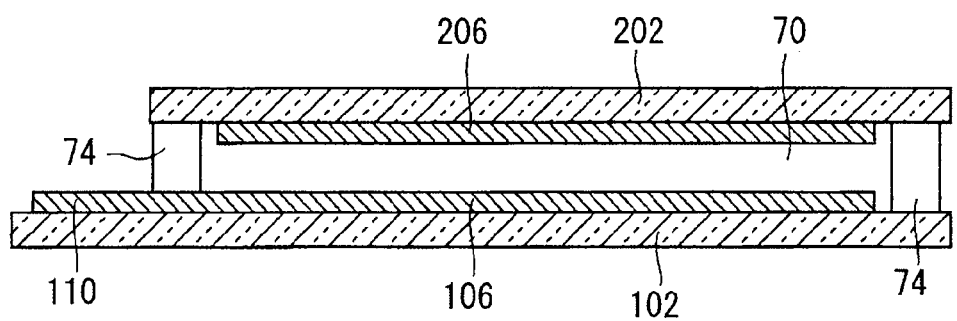
FIG. 12 is a sectional view explaining the manufacturing process for the display device according to Embodiment 1.

Next, as shown in FIGS. 10 and 11, the insulating substrate 112 is cut in a position of a section line 114, and the insulating substrate 212 is cut in a position of a section line 214. Thereby, the substrates are cut into liquid crystal panels each having the insulating substrates 102, 202 as shown in FIG. 12.

Subsequently, as shown in FIG. 13, the polarization plate 120 is bonded onto the insulating substrate 102, and the polarization plate 220 is bonded onto the insulating substrate 202. This can give the liquid crystal panel 52 with the above exemplified structure.

Figure 14:
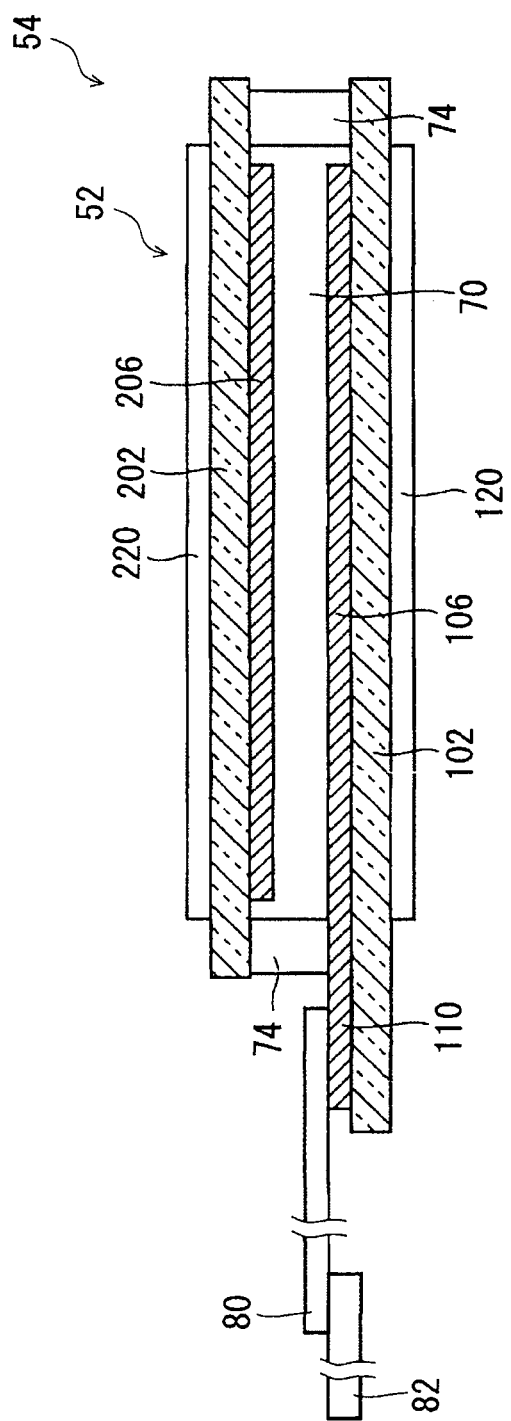
FIG. 14 is a sectional view explaining the manufacturing process for the display device according to Embodiment 1.

Then, as shown in FIG. 14, one end of the external wiring 80 is connected to the external wiring connecting terminal 110 by, for example, crimping. Moreover, the other end of the external wiring 80 is connected with the control substrate 82. This can give the body module 54 having the above exemplified structure. It is to be noted that either the connection between the external wiring 80 and the external wiring connecting terminal 110 or the connection between the external wiring 80 and the control substrate 82 may be the first to implement.

Figure 15:
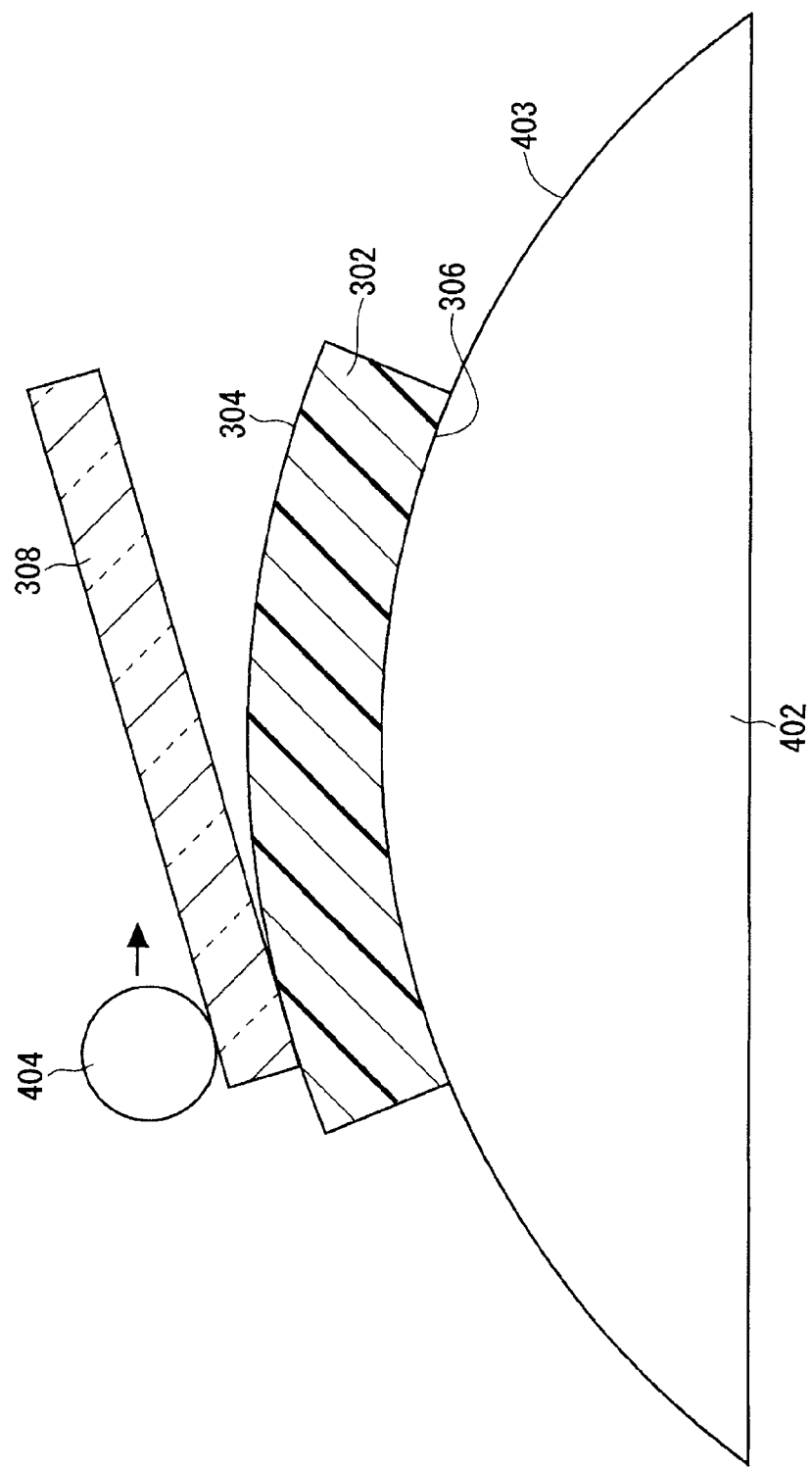
FIG. 15 is a sectional view explaining the manufacturing process for the display device according to Embodiment 1.

Thereafter, as shown in FIG. 15, the supporting substrate 302 is placed on a workbench 402. By this time, the supporting substrate 302 is prepared as a curved plate-like member previously having the above curved surfaces 304, 306. The workbench 402 has a convex surface 403 formed in the same curved form as the curved surfaces 304, 306 of the supporting substrate 302. The supporting substrate 302 is placed on the workbench 402 in a state where the concave surface 306 of the supporting substrate 302 is turned to the convex surface 403 of the workbench 402 and the curved forms of both curved surfaces 306, 403 are matched with each other.

Next, as shown in FIG. 15, the gel adhesive layer 308 previously molded into a sheet form is placed on the convex surface 304 of the supporting substrate 302, and bonded to the supporting substrate 302 with use of a roller 404. This can form the adhesive layer 308 on the convex surface 304 of the supporting substrate 302. It should be noted that at this time, the adhesive layer 308 has a uniform thickness (the order of 1 mm in the above exemplification).

Figure 16:
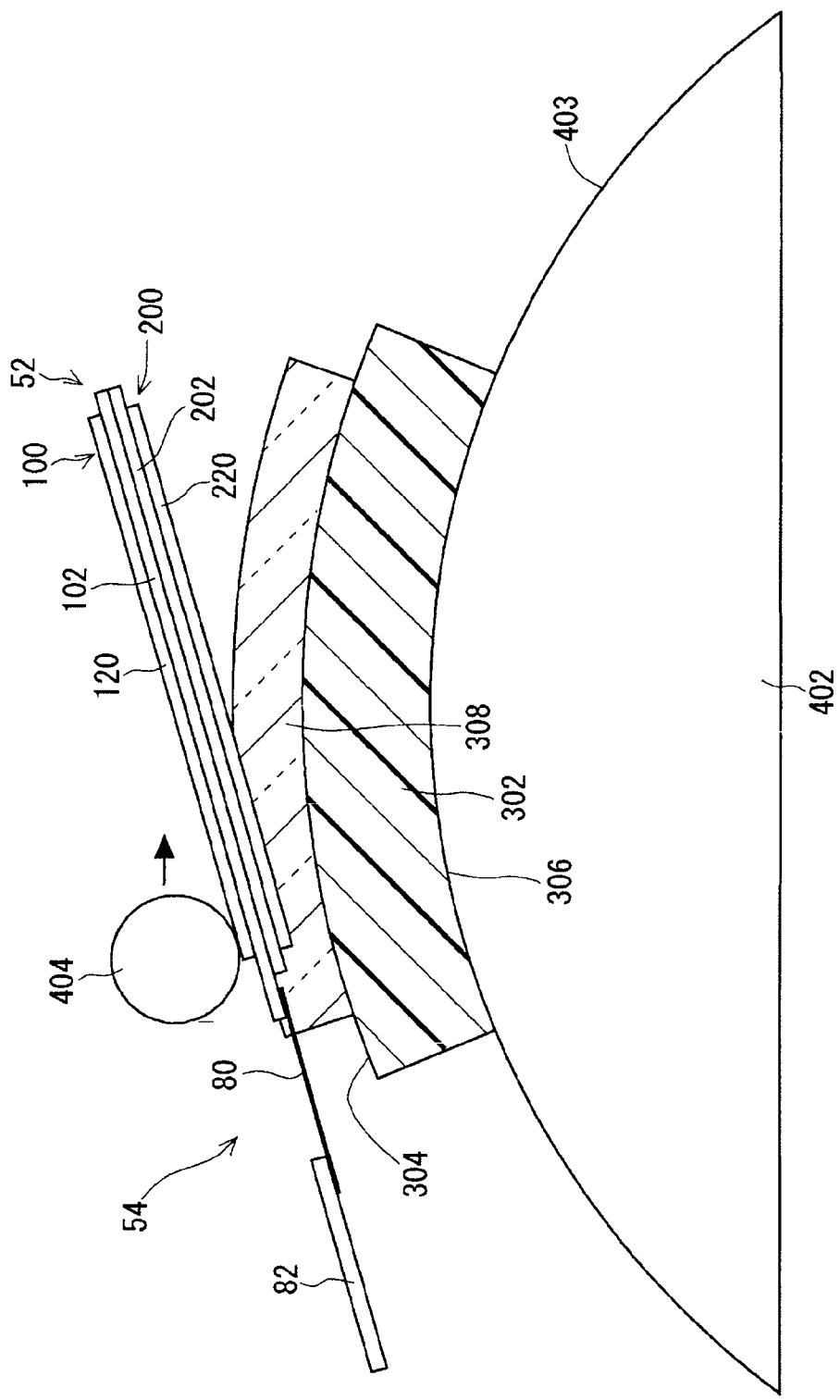
FIG. 16 is a sectional view explaining the manufacturing process for the display device according to Embodiment 1.
Figure 17:
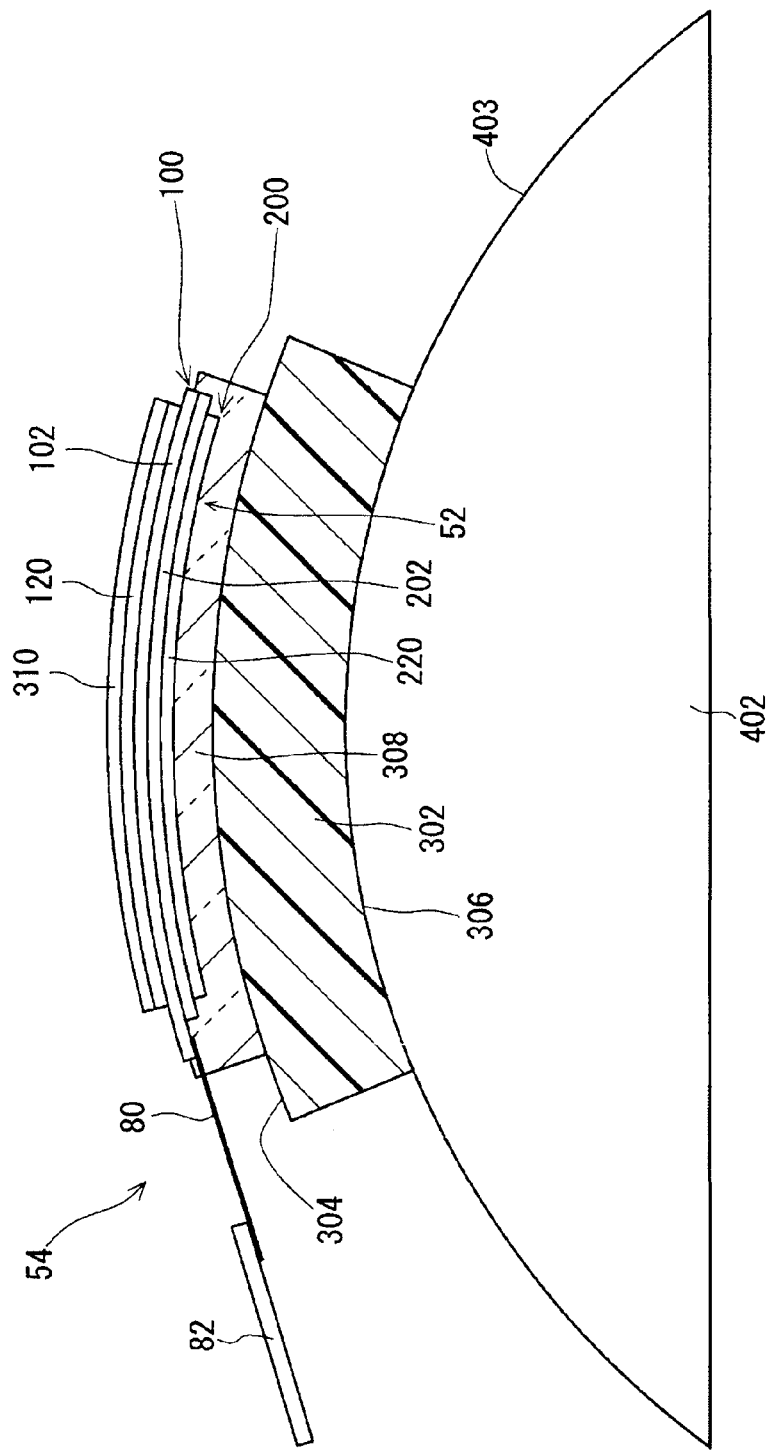
FIG. 17 is a sectional view explaining the manufacturing process for the display device according to Embodiment 1.

Subsequently, as shown in FIG. 16, the liquid crystal panel 52 is placed on the adhesive layer 308 bonded to the supporting substrate 302. It is to be noted that herein, the liquid crystal panel 52 is supplied in the form of the already assembled body module 54. The liquid crystal panel 52 is placed with the color filter substrate 200 side turned to the adhesive layer 308. Pressure is then applied from the array substrate 100 side with the roller 404, to wholly bond the liquid crystal panel 52 to the adhesive layer 308. As shown in FIG. 17, this brings the liquid crystal panel 52 into the state of being curved along the convex surface 304 of the supporting substrate 302.

In addition, the liquid crystal panel 52 is pressed into the gel adhesive layer 308 with the roller 404. This brings the color filter substrate 200 side into the state of being pressed into the gel adhesive layer 308 as described above.

Although the bonding by roller crimping system has been herein exemplified, the liquid crystal panel 52 may be bonded by vacuum crimping system, or the like.

Thereafter, as shown in FIG. 17, the diffusion sheet 310 is placed on the polarization plate 120 of the liquid crystal panel 52 bonded to the supporting substrate 302.

Next, the back light module 312 is placed on the diffusion sheet 310 and fixed thereto. After installation of the back light module 312, the external wiring 80 is bent, to fix the control substrate 82 onto the back light module 312 (cf. FIG. 3).

The assembled structure is accommodated into the frame 318 (cf. FIG. 3) and fixed thereto, to give the liquid crystal display device 50 having the above configuration.

It is to be noted that the case has been exemplified above where the bonding step for the liquid crystal panel 52 is performed in the state of being connected with the control substrate 82. In place of this, the bonding step for the liquid crystal panel 52 may be performed in the state of not connected with the control substrate 82, and the connecting step for the control substrate 82 and the external wiring 80 may then be performed. In this case, the connecting step can, for example, be implemented after the installation step for the back light module 312.

In the following, the liquid crystal display device 50 is further described with reference to FIGS. 18 to 25.

Herein, first, a liquid crystal display device 500 for comparison with the liquid crystal display device 50 is described. FIG. 18 is a perspective view explaining the display device 500 for comparison. As shown in FIG. 18, the display device 500 for comparison is common with the liquid crystal display device 50 in having the curved liquid crystal panel 52. However, both liquid crystal display devices 500, 50 are significantly different from each other in the other constitutional elements and the manufacturing method.

More specifically, the display device 500 for comparison has a structure where a supporting substrate 502 is connected to the liquid crystal panel 52 with an adhesive 504. The supporting substrate 502 is originally a plate-like member. Further, the adhesive 504 is a thermal cure or ultraviolet cure adhesive. It is to be noted that for the sake of simplicity of description, illustrations and descriptions are omitted with regard to the other configurations of the display device 500 for comparison.

The display device 500 for comparison is manufactured in the following manner. That is, the plate-like liquid crystal panel 52 and the plate-like supporting substrate 502 are made to adhere to each other with the adhesive 504, and the adhesive 504 is cured. After the curing of the adhesive 504, the bonded structure in a plate state (bonded structure of the liquid crystal panel 52 and the supporting substrate 502) is curved. Such a curved state is supported at the periphery of the above bonded structure so as to be retained. It is to be noted that in FIG. 18 and the like, a case is exemplified where the liquid crystal panel 52 is curved having its long sides as the curved sides.

Figure 19:
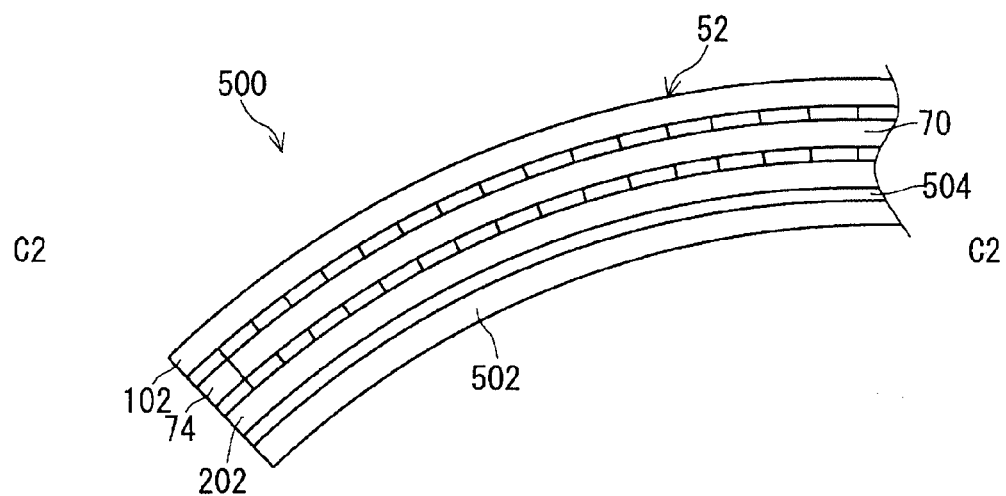
FIG. 19 is a sectional view along a line C2-C2 in FIG. 18.
Figure 20:
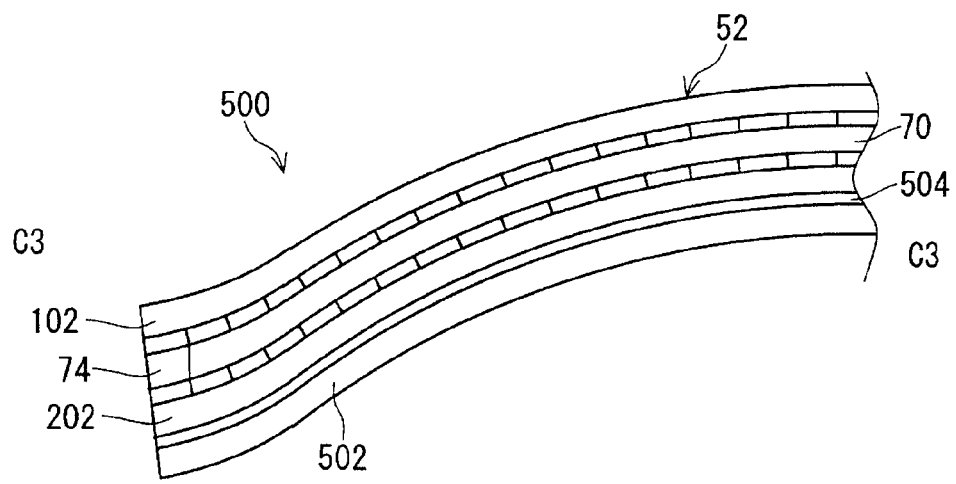
FIG. 20 is a sectional view along a line C3-C3 in FIG. 18.

FIGS. 19 and 20 show schematic sectional views along a line C2-C2 and a line C3-C3 in FIG. 18. As shown in FIG. 19, a curvature of the liquid crystal panel 52 is almost constant in the vicinity of the periphery of the supporting substrate 502, namely a curve retaining part.

On the other hand, as shown in FIG. 20, distortion is seen in the curved form of the liquid crystal panel 52 in a position distant from the curve retaining part, as compared with the vicinity of the curve retaining part in FIG. 19. This is considered because at a position more distant from the curve retaining part, the elastic force of the above bonded structure intending to return to the plate form is dominant as compared with curve retentivity applied to the curve retaining part. In addition, in the case of the display device 500 for comparison, it is considered that the elastic force of the bonded structure is attributed to the liquid crystal panel 52 and the supporting substrate 502 which were originally in plate-like form, and the adhesive 504 which was cured at the time of the liquid crystal panel 52 and the supporting substrate 502 being in the plate state.

Figure 21:
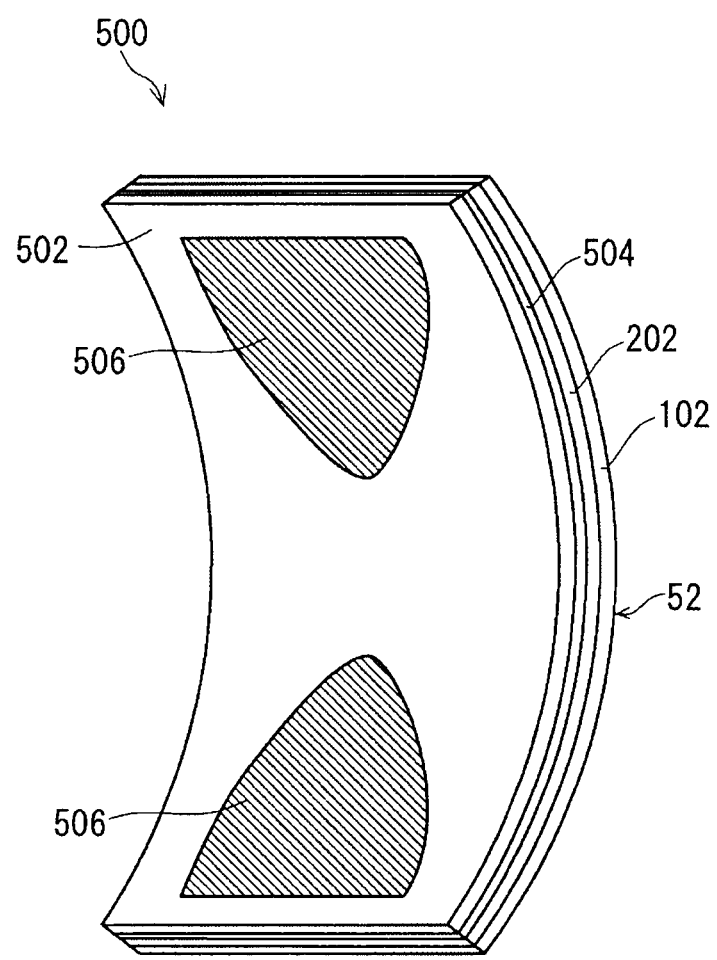
FIG. 21 is a schematic view explaining display quality of the display device for comparison.

Therefore, stress bias, namely stress concentration, occurs in the liquid crystal panel 52 in the display device 500 for comparison. The stress concentration, for example, induces deterioration of the liquid crystal panel 52 in fracture strength and in display quality due to occurrence of display unevenness. In addition, FIG. 21 shows a schematic explanatory view of display unevenness. In FIG. 21, a hatched region 506 exemplifies a region with a high light passing degree, as compared with the other region.

Figure 22:
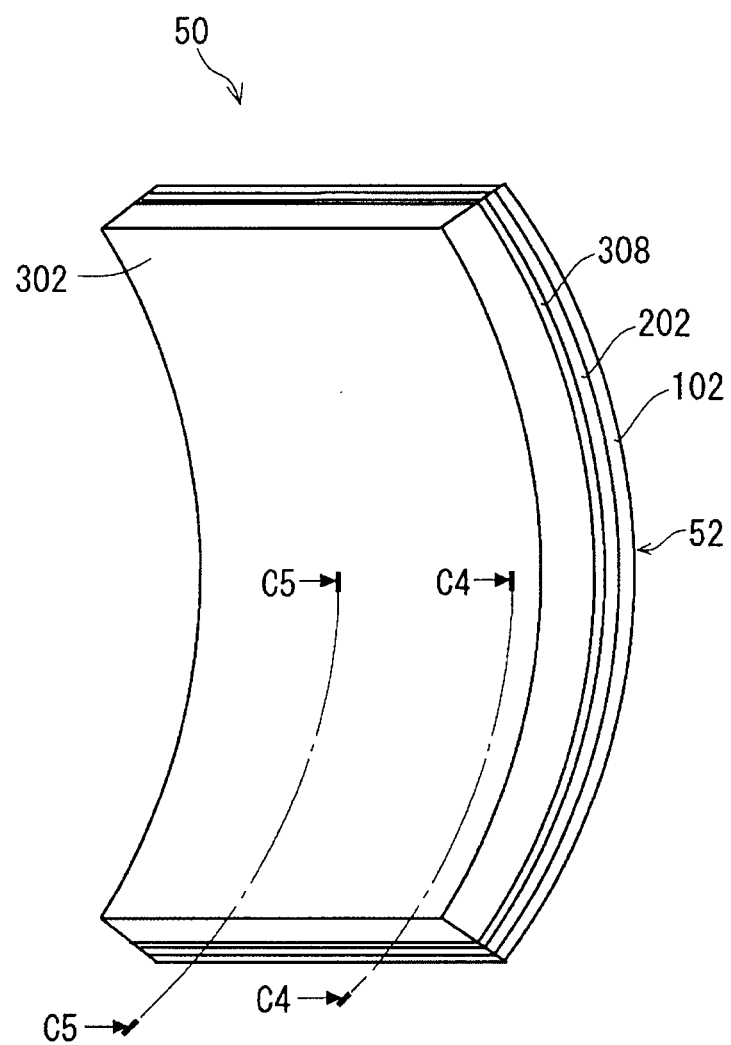
FIG. 22 is a perspective view explaining the display device according to Embodiment 1.
Figure 23:
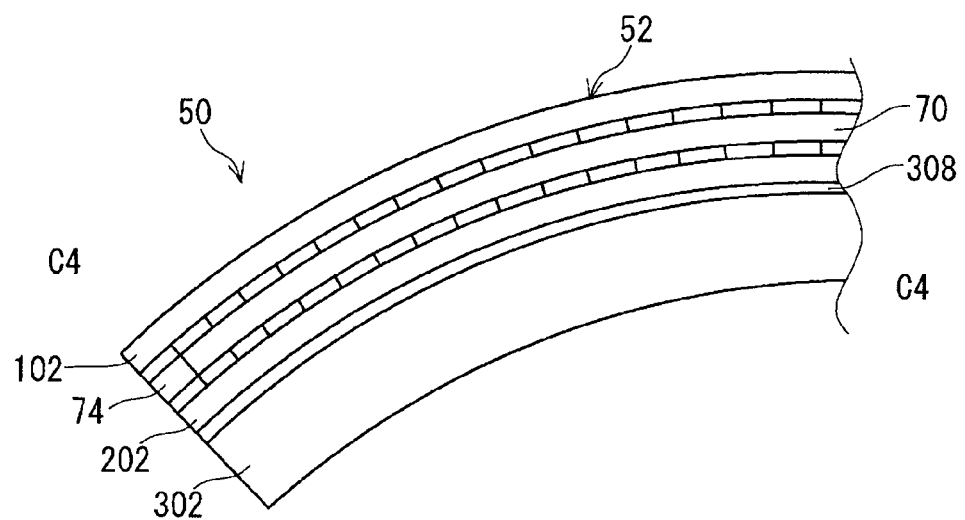
FIG. 23 is a sectional view along a line C4-C4 in FIG. 22.
Figure 24:
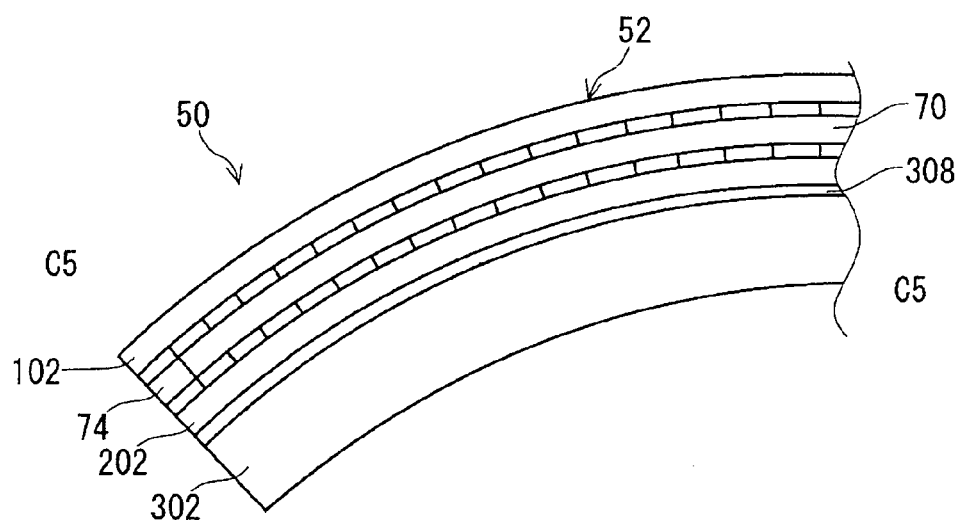
FIG. 24 is a sectional view along a line C5-C5 in FIG. 22.

Next, the liquid crystal display device 50 according to Embodiment 1 is described. FIG. 22 shows a perspective view schematically showing the liquid crystal display device 50, and FIGS. 23 and 24 show sectional views along a line C4-C4 and a line C5-C5 in FIG. 22. FIGS. 22 to 24 are shown contrastively with FIGS. 18 to 20 above. It should be noted that in FIG. 22 and the like, the liquid crystal display device 50 is illustrated in a simple manner by means of part of the elements of the liquid crystal display device 50 for the sake of simplicity of descriptions. Further, in FIG. 22 and the like, a case is exemplified where the liquid crystal panel 52 is curved having the long sides as the curved sides.

According to the liquid crystal display device 50, the liquid crystal panel 52 has a similar curved form, such as the same curve radius, in the vicinity of a periphery illustrated in FIG. 23 and in the position distant from the periphery which is illustrated in FIG. 24.

Figure 25:
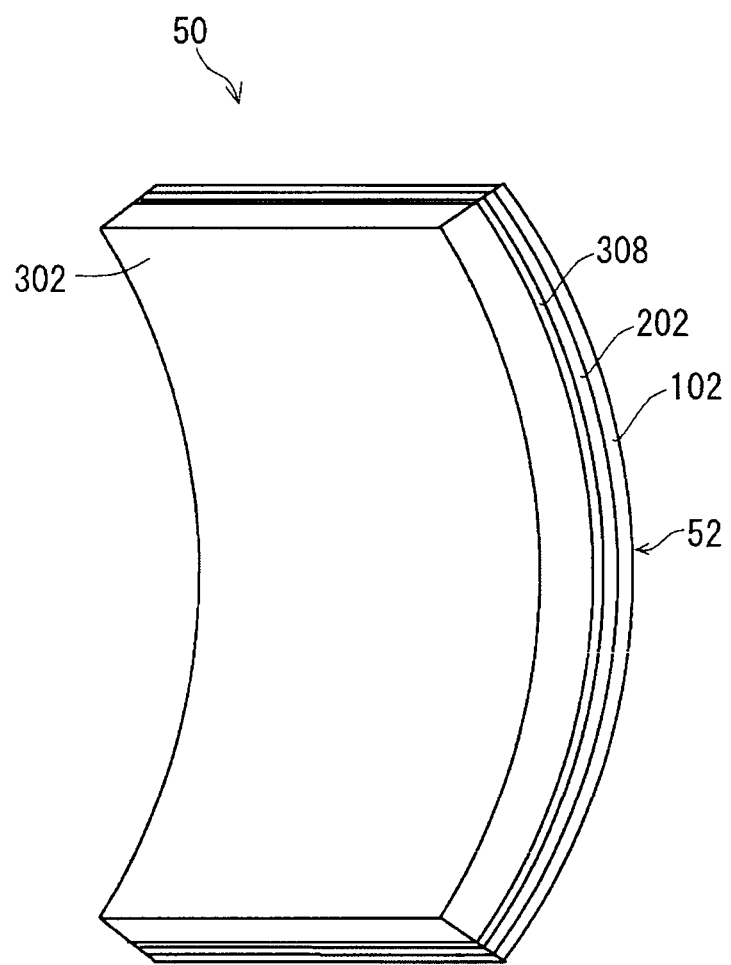
FIG. 25 is a schematic view explaining display quality of the display device according to Embodiment 1.

This is attributed to bonding of the liquid crystal panel 52 to the curved surface 304 of the previously curved supporting substrate 302 in the liquid crystal display device 50. This can suppress local concentration of stress in the liquid crystal panel 52, as compared with the display device 500 for comparison obtained by bonding the liquid crystal panel 52 and the plate member 502 to each other and then curving them. As thus described, since the stress concentration induces deterioration in display quality and the like, according to the liquid crystal display device 50, it is possible to obtain high display quality. For example, as shown in FIG. 25, generation of the region 506 with a high light passing degree (cf. FIG. 21) can be suppressed.

Further, since the stress concentration induces deterioration in mechanical strength, according to the liquid crystal display device 50, it is possible to obtain high mechanical strength. Moreover, since the supporting substrate 302 protects the liquid crystal panel 52 from an external force, it is possible to obtain high protectivity and durability. Therefore, according to the liquid crystal display device 50, it is possible to obtain high reliability. It is to be noted that in view of such an effect, the supporting substrate 302 can also be referred to as a protective substrate 302.

In particular, the supporting substrate 302 has higher stiffness than the liquid crystal panel 52 as described above, and it is thereby possible to more reliably obtain the curved form of the liquid crystal panel 52. Further, the higher the stiffness, the more the variations in curved form of the supporting substrate 302 before and after the bonding of the liquid crystal panel 52 can be suppressed, thereby to facilitate previous designing of the curved form of the liquid crystal panel 52.

Incidentally, in the liquid crystal display device 50, the thermal cure or ultraviolet cure adhesive 504 can also be employed in place of the adhesive layer 308, and also in this case, it is possible to obtain the above effect due to adoption of the previously curved supporting substrate 302. On the other hand, according to the adhesive layer 308 having flexibility in the liquid crystal display device 50 not only during the manufacturing but also in a completed state as described above, the following effect can be obtained.

For example, the adhesive layer 308 with flexibility acts as a buffer layer against a shock and a vibration. This can make protectivity, durability and the like high, as compared with the display device 500 for comparison where the adhesive 504 is cured.

Further, in the display device 500 where the adhesive 504 is cured, the cured adhesive 504 makes a tensile force generated between the liquid crystal panel 52 and the plate member 502 when the liquid crystal panel 52 is curved. On the other hand, according to the adhesive layer 308 with flexibility, such a force can be absorbed. This allows further suppression of the stress concentration in the liquid crystal panel 52. It is therefore possible to promote further improvement in mechanical strength, reliability and the like, and further improvement in display quality.

The above variety of effects of the liquid crystal display device 50 are also exerted during the manufacturing, to contribute to improvement in yield and the like. For example, suppressing the stress concentration described above, and the like, can prevent damage on the liquid crystal panel 52 during the manufacturing.

As exemplified in FIG. 3, the portion protruding from the liquid crystal panel 52 in the adhesive layer 308 is present in an extended manner on the end surfaces of the insulating substrates 102, 202, namely the end surface of the liquid crystal panel 52.

Specifically, in the portion of the adhesive layer 308 protruding from the liquid crystal panel 52, namely in the adhesive layer 308 having been formed into the concave form by bonding of the liquid crystal panel 52, the end surface of the liquid crystal panel 52 is covered by the adhesive layer 308. With such a configuration formed, the end surface of the liquid crystal panel that is most subject to damage is protected by the adhesive layer 308. This can buffer a shock and a vibration applied to the end surface of the panel, and hence there is an advantage in suppressing generation of a crack in the end surface and growth of an already existing crack in the end surface.

On the other hand, when the adhesive layer 308 is configured with the same size as or a smaller size than the liquid crystal panel 52, the end surface of the liquid crystal panel 52 is not protected, and the buffer effect is thus not obtained at the time of application of a vibration or a shock, making the liquid crystal panel 52 subject to damage.

It is to be noted that comparison between the liquid crystal display device 50 according to Embodiment 1 and the above display device 500 for comparison reveals difference as follows.

For example, a difference is seen in the curved form as described above. In the liquid crystal display device 50 according to Embodiment 1, it is possible to make the liquid crystal panel 52 have a homogeneous curved form, for example an approximately single curvature, across the entire panel (cf. FIGS. 23, 24). As opposed to this, in the display device 500 for comparison, it is difficult to obtain a homogeneous curved state (cf. FIGS. 19, 20)

Further, a difference is seen in material, plate thickness and the like between the supporting substrates 302 and 502. In the display device 500 for comparison, with the liquid crystal panel 52 and the supporting substrate 502 needing to be curved after bonded to each other, the supporting substrate 502 is made up of a soft material or a member with a small plate thickness. On the other hand, the supporting substrate 302 of the liquid crystal display device 50 according to Embodiment 1 is required to have high stiffness as described above, thus being different in that the material is hard, the plate thickness is large and the like as compared with the supporting substrate 502 for comparison.

Moreover, a difference is seen in retention of the curved state. In the display device 500 for comparison, when the liquid crystal panel 52 with the supporting substrate 502 is removed out of the device, the retention of the curved state is released and the liquid crystal panel 52 intends to return to the plate form. As opposed to this, in the liquid crystal display device 50 according to Embodiment 1, even when the liquid crystal panel 52 with the supporting substrate 302 is removed out of the device, the liquid crystal panel 52 is retained in the curved form by the supporting substrate 302.

Embodiment 2

Figure 26:
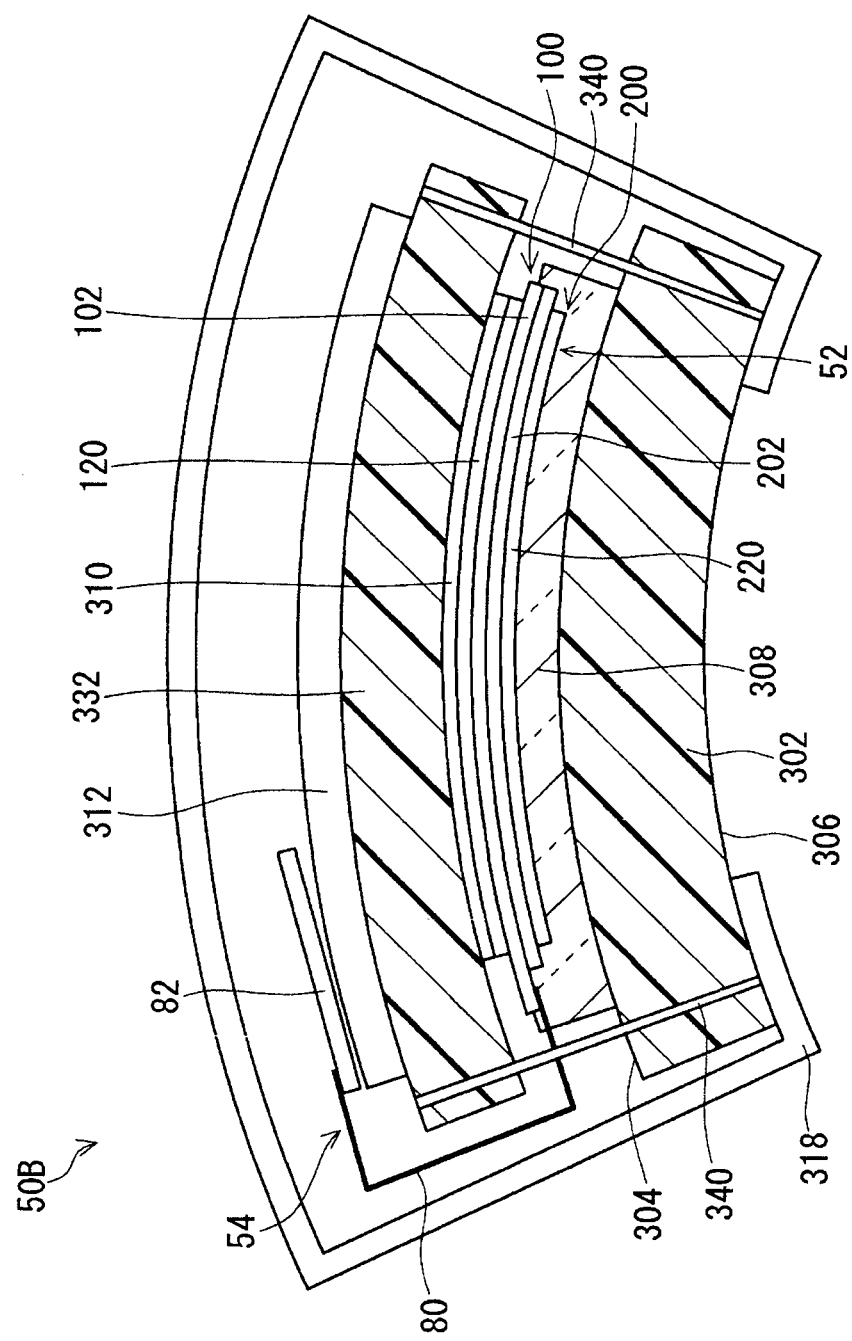
FIG. 26 is a sectional view explaining a display device according to Embodiment 2.

FIG. 26 exemplifies a liquid crystal display device 50B as an example of a display device according to Embodiment 2 of the present invention. FIG. 26 is a sectional view corresponding to FIG. 3.

The liquid crystal display device 50B has a configuration of the liquid crystal display device 50 (cf. FIG. 3) according to Embodiment 1 added with a supporting substrate 332 and screws 340. It is to be noted that FIG. 26 schematically illustrates the screws 340. The other configurations of the liquid crystal display device 50B are basically similar to those of the above liquid crystal display device 50 (cf. FIG. 3).

The supporting substrate 332 is arranged on the array substrate 100 side outside the liquid crystal panel 52, along with the diffusion sheet 310 and the back light module 312. More specifically, the diffusion sheet 310, the supporting substrate 332 and the back light module 312 are stacked in this order on the polarization plate 120 of the array substrate 100. The supporting substrate 332 is fixed to the supporting substrate 302 on the color filter substrate 200 side, with the screws 340.

Thereby, the liquid crystal panel 52 is sandwiched between the supporting substrates 302 and 332 which are arranged as opposed to each other via the liquid crystal panel 52. The supporting substrate 332 is originally a plate-like member, and fixed with the screws 340 in the state of being curved along the curved form of the liquid crystal panel 52. Hence the liquid crystal panel 52 is pressed to the supporting substrate 302 due to elasticity of the supporting substrate 332 and fixation with use of the screws 340, and thereby being retained on both supporting substrates 302, 332.

The supporting substrate 332 is originally a plate-like member as described above. The supporting substrate 332 has lower stiffness (namely higher flexibility) than the liquid crystal panel 52, and is configured so as to be easy to transform as compared with the liquid crystal panel 52. In addition, it is considered that the insulating substrates 102, 202 most contribute to the stiffness of the liquid crystal panel 52 among the constitutional elements of the liquid crystal panel 52. In view of such a respect, it is also possible to grasp that the supporting substrate 332 has lower stiffness than the insulating substrates 102, 202.

Such stiffness can be provided for example by adjustment of the thickness. For example when the glass substrates constituting the insulating substrates 102, 202 have thicknesses of the order of 0.1 to 0.2 mm, the supporting substrate 332 can be made up of an acrylic substrate or a polycarbonate substrate having a thickness of the order of 0.5 to 1.5 mm.

The supporting substrate 332 preferably has a thickness larger than the liquid crystal panel 52 and smaller than the supporting substrate 302. This allows provision of flexibility, as well as provision of stiffness that can resist the force (elastic force) of the liquid crystal panel 52 intending to return to the plate form, to the supporting substrate 332.

The supporting substrate 302 is made up of a transparent material so as to allow passage of emitted light from the back light module 312 to the liquid crystal panel 52 side. The transparent supporting substrate 332 can be made up of an acrylic or polycarbonate resin as exemplified above.

In the liquid crystal display device 50B, the supporting substrate 332 located on the rear surface side of the liquid crystal panel 52 is small as compared with the supporting substrate 302 located on the display surface side of the liquid crystal panel 52. This can facilitate to ensure a space for leading the external wiring 80 connected to the liquid crystal panel 52 to the rear surface side of the liquid crystal panel 52 (cf. FIG. 26). It is thereby possible to prevent disconnection and short circuit due, for example, to contact between the external wiring 80 and the frame 318, and the like. Hence it is possible to obtain high reliability.

Next, a manufacturing method for the liquid crystal display device 50B is described with reference to FIGS. 27 and 28.

First, for example through use of the manufacturing method exemplified in Embodiment 1, the body module 54 is manufactured (cf. FIGS. 6 to 14). Then, for example through use of the manufacturing method exemplified in Embodiment 1, the liquid crystal panel 52 is bonded onto the supporting substrate 302 (cf. FIGS. 15 to 17) and the diffusion sheet 310 is then arranged on the polarization plate 120 of the liquid crystal panel 52 (cf. FIG. 17).

Figure 27:
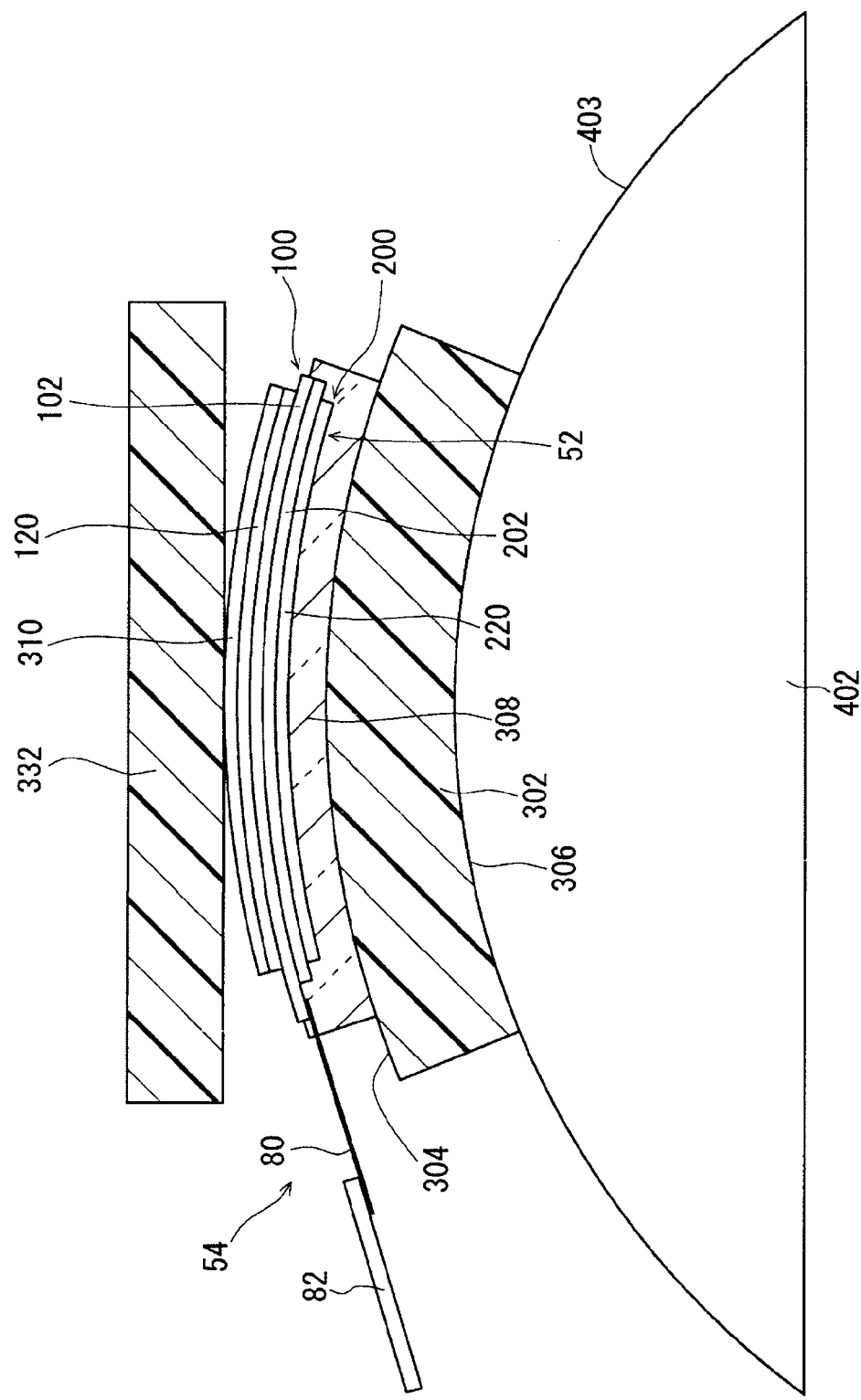
FIG. 27 is a sectional view explaining a manufacturing process for the display device according to Embodiment 2.
Figure 28:
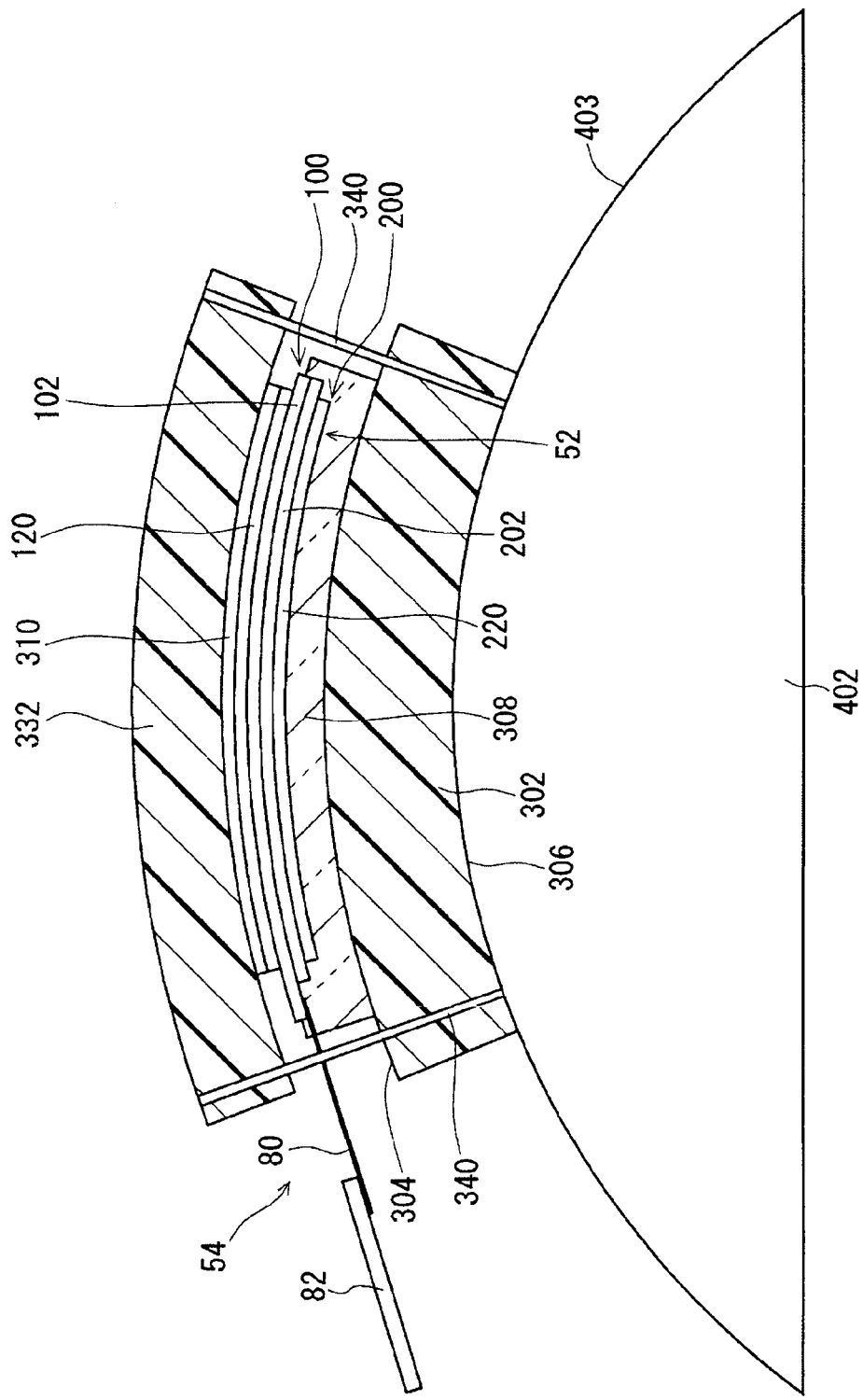
FIG. 28 is a sectional view explaining the manufacturing process for the display device according to Embodiment 2.

Next, as shown in FIG. 27, the supporting substrate 332 in the plate state is placed on the diffusion sheet 310, and the supporting substrates 332, 302 are fixed with the screws 340 as shown in FIG. 28. This makes the supporting substrate 332 curved along the curved form of the liquid crystal panel 52, namely along the convex surface 304 of the supporting substrate 302. Further, the liquid crystal panel 52 is sandwiched between the supporting substrates 302, 332, and pressed into the curved form.

Then, the back light module 312 is placed on the supporting substrate 332 and fixed thereto. In the subsequent steps, for example, the manufacturing method exemplified in Embodiment 1 can be adopted.

According to the liquid crystal display device 50B, an effect similar to that of the liquid crystal display device 50 can be obtained, while a variety of effects can be obtained based on differences from the liquid crystal display device 50B.

For example, in the liquid crystal display device 50B, the liquid crystal panel 52 is pressed into the curved state by the supporting substrates 302, 332 and the screws 340. This allows reliable retainment of the curved form of the liquid crystal panel 52 as compared with the liquid crystal display device 50. The liquid crystal display device 50B is preferred especially when the force (elastic force) of the liquid crystal panel 52 intending to return to the plate form acts to a large degree. It is therefore possible, for example, to provide a display device with a larger-sized liquid crystal panel, a display device with a liquid crystal panel having a larger curve, and the like.

Further, according to the supporting substrate 332, it is possible to protect the display panel 52 from an external force, along with the supporting substrate 302. It is thereby possible to obtain high reliability.

Moreover, with the liquid crystal panel 52 retained in the curved form by the supporting substrates 302, 332 and the screws 340, there is a low need for the back light module 312 in the curved form to support the liquid crystal panel 52 from the rear surface side, as compared with the liquid crystal display device 50. For this reason, a plate-type back light module can also be adopted. However, as described above, according to the back light module 312 in the curved form, it is possible to wholly illuminate the liquid crystal panel 52 with the same light amount, so as to obtain high display quality.

Although the case has been exemplified above where the screws 340 are used for fixing the supporting substrates 302, 332, the supporting substrates 302, 332 may be fixed by another fixing means, such as an ultraviolet cure adhesive.

It is to be noted that in the liquid crystal display device 50B, the diffusion sheet 310 is arranged between the liquid crystal panel 52 and the supporting substrate 332. Even with such an arrangement form, the forgoing effect due to the diffusion sheet 310 can be obtained. That is, direct contact between the liquid crystal panel 52 and the supporting substrate 332 is avoided, thereby to allow prevention of damage on both 52, 332. Further, even when a nonuniform void is generated both/either between the back light module 312 and the supporting substrate 332 and/or between the supporting substrate 332 and the liquid crystal panel 52, it is possible to suppress an interference fringe caused by such a void.

Incidentally, the case has been exemplified above where the supporting substrate 332 is the plate-like member. As opposed to this, the supporting substrate 332 can also be made up of a member previously curved in a similar manner to the supporting substrate 302. Also in this case, it is possible to sandwich and retain the liquid crystal panel 52 in the curved state by the supporting substrates 302, 332 and the fixing means such as the screws 340.

Embodiment 3

Figure 29:
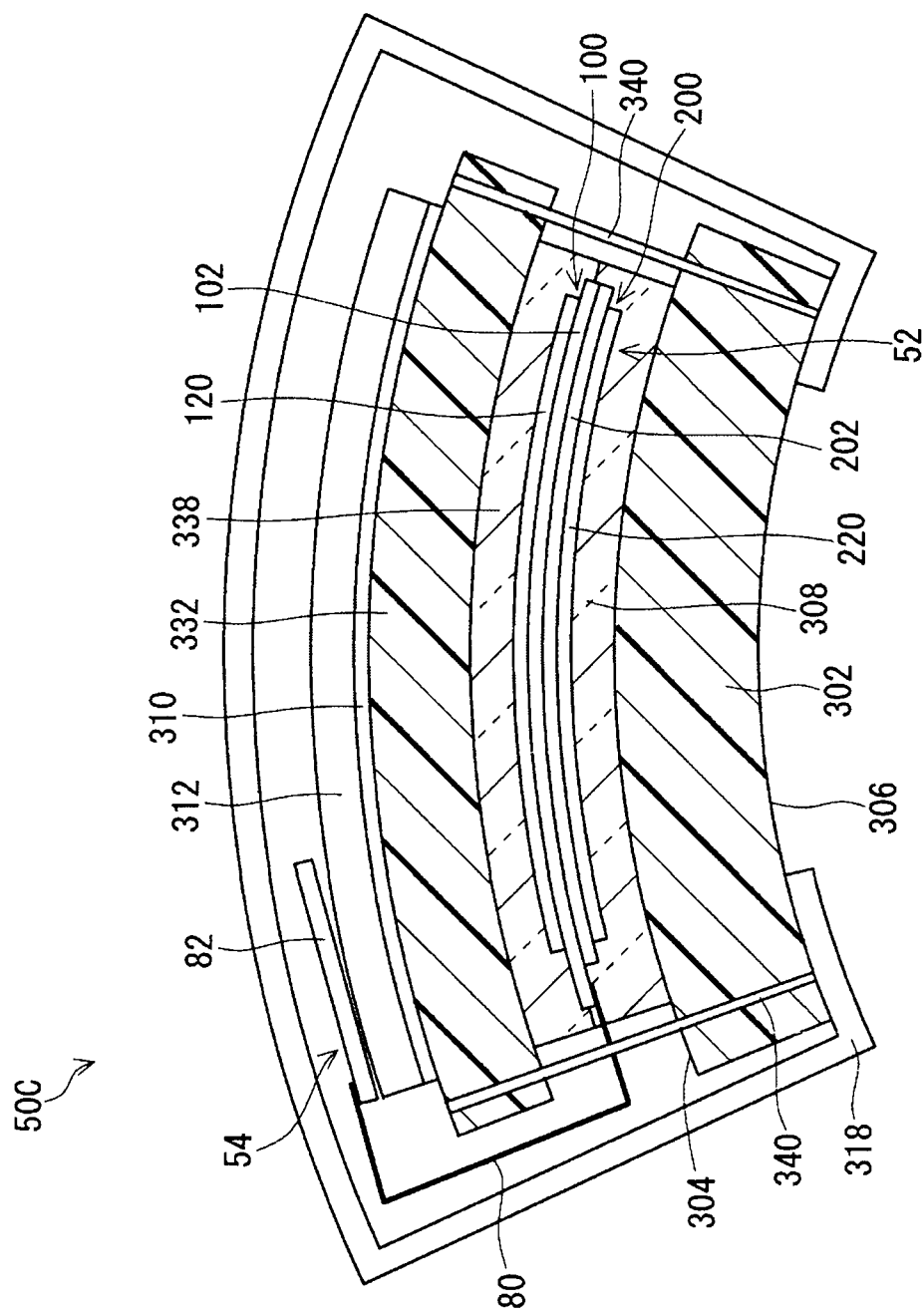
FIG. 29 is a sectional view explaining a display device according to Embodiment 3.

FIG. 29 exemplifies a liquid crystal display device 50C as an example of a display device according to Embodiment 3 of the present invention. FIG. 29 is a sectional view corresponding to FIGS. 3 and 26.

The liquid crystal display device 50C has a configuration of the liquid crystal display device 50B (cf. FIG. 26) according to Embodiment 2 added with an adhesive layer 338. The other configurations of the liquid crystal display device 50C are basically similar to those of the above liquid crystal display device 50B (cf. FIG. 26).

The adhesive layer 338 is arranged on the array substrate 100 side outside the liquid crystal panel 52, along with the supporting substrate 332, the diffusion sheet 310 and the back light module 312. More specifically, the adhesive layer 338, the supporting substrate 332, the diffusion sheet 310 and the back light module 312 are stacked in this order on the polarization plate 120 of the array substrate 100. Thereby, the liquid crystal panel 52 and the supporting substrate 332 are bonded to each other with the adhesive layer 338.

Herein, a case is exemplified where the adhesive layer 338 is made up of a material similar to the adhesive layer 308.

In the illustrated example, the adhesive layer 338 is present in an extended manner between the liquid crystal panel 52 and the supporting substrate 332, and present in an extended manner further beyond the liquid crystal panel 52. In this case, the adhesive layer 338 is provided in a wider range than the liquid crystal panel 52. In the adhesive layer 338, a preferable width of the portion protruding from the liquid crystal panel 52 is, for example, not smaller than 5.0 mm. However, the adhesive layer 308 is within a range on the the main surface of the supporting substrate 332.

Moreover, in the illustrated example, the portion protruding from the liquid crystal panel 52 in the adhesive layer 338 is present in an extended manner on the end surfaces of the liquid crystal panel 52. With such a form, it is possible to prevent occurrence of peeling between the liquid crystal panel 52 and the supporting substrate 332 from the end of the panel. This allows more reliable adherence between the liquid crystal panel 52 and the supporting substrate 332. It is thereby possible to obtain high reliability.

Similarly to the adhesive layer 308, the adhesive layer 338 is preferably formed to have a thickness of the order of 1 mm with respect to the liquid crystal panel 52 having a thickness of the order of 0.7 to 0.8 mm.

Next, a manufacturing method for the liquid crystal display device 50C is described with reference to FIGS. 30 to 32.

First, for example through use of the manufacturing method exemplified in Embodiment 1, the body module 54 is manufactured (cf. FIGS. 6 to 14). Then, for example through use of the manufacturing method exemplified in Embodiment 1, the liquid crystal panel 52 is bonded onto the supporting substrate 302 (cf. FIGS. 15 to 17).

Figure 30:
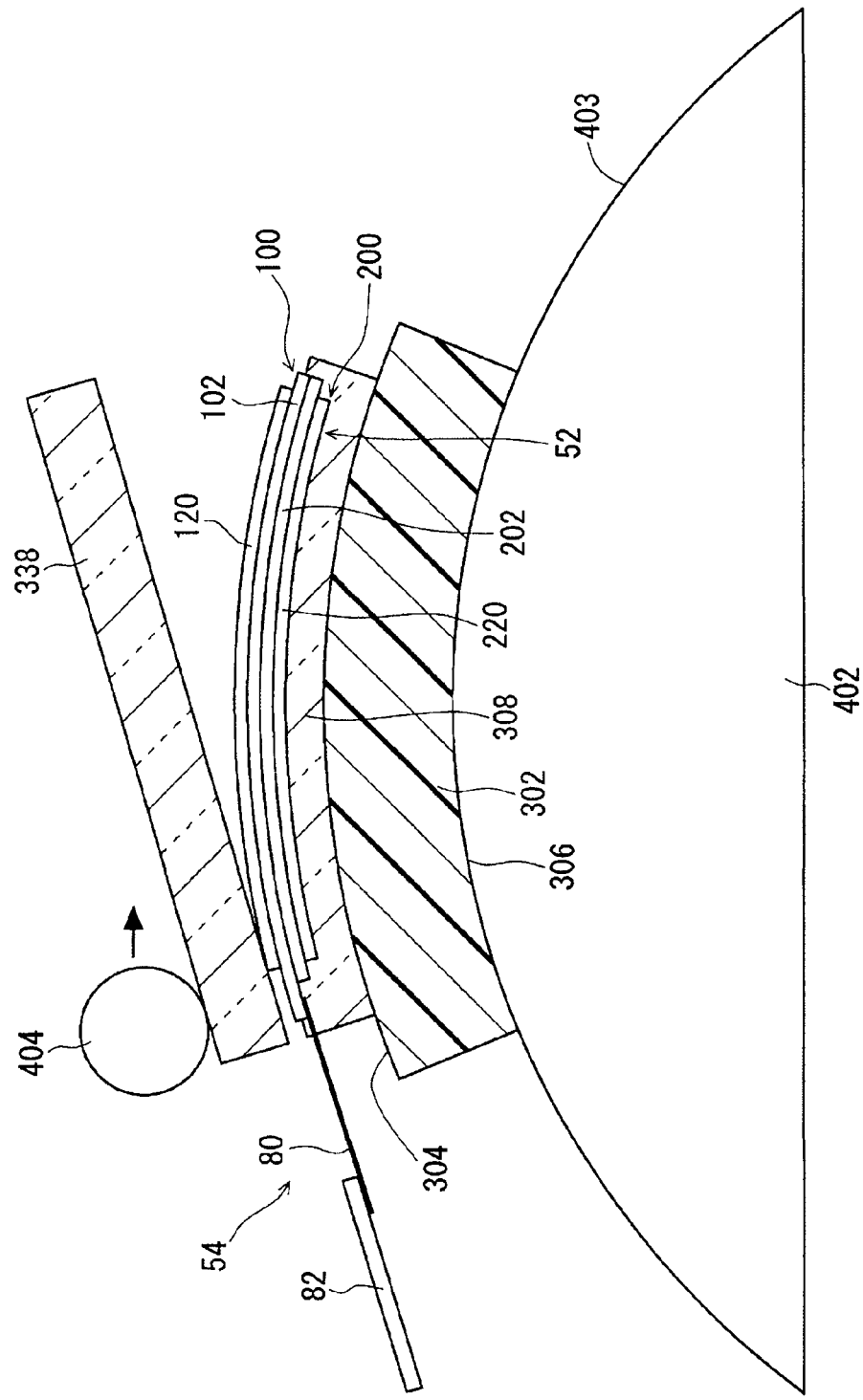
FIG. 30 is a sectional view explaining a manufacturing process for the display device according to Embodiment 3.

Next, as shown in FIG. 30, the adhesive layer 338 previously molded into a sheet form is placed on the liquid crystal panel 52 bonded to the supporting substrate 302, and bonded to the liquid crystal panel 52 with use of the roller 404. This makes the adhesive layer 338 bonded along the curved liquid crystal panel 52, namely along the convex surface 304 of the supporting substrate 302, as shown in FIG. 31.

In such a bonding step, the adhesive layer 338 is transformed in accordance with the surface form of the liquid crystal panel 52 by pressing force of the roller 404, and the liquid crystal panel 52 is thereby buried into the adhesive layers 338, 308. Further, while the adhesive layer 338 is transformed as thus described, the top surface of the adhesive layer 338 (surface as the rear surface with respect to the surface opposed to the liquid crystal panel 52) is formed flat by pressing force of the roller 404.

Figure 31:
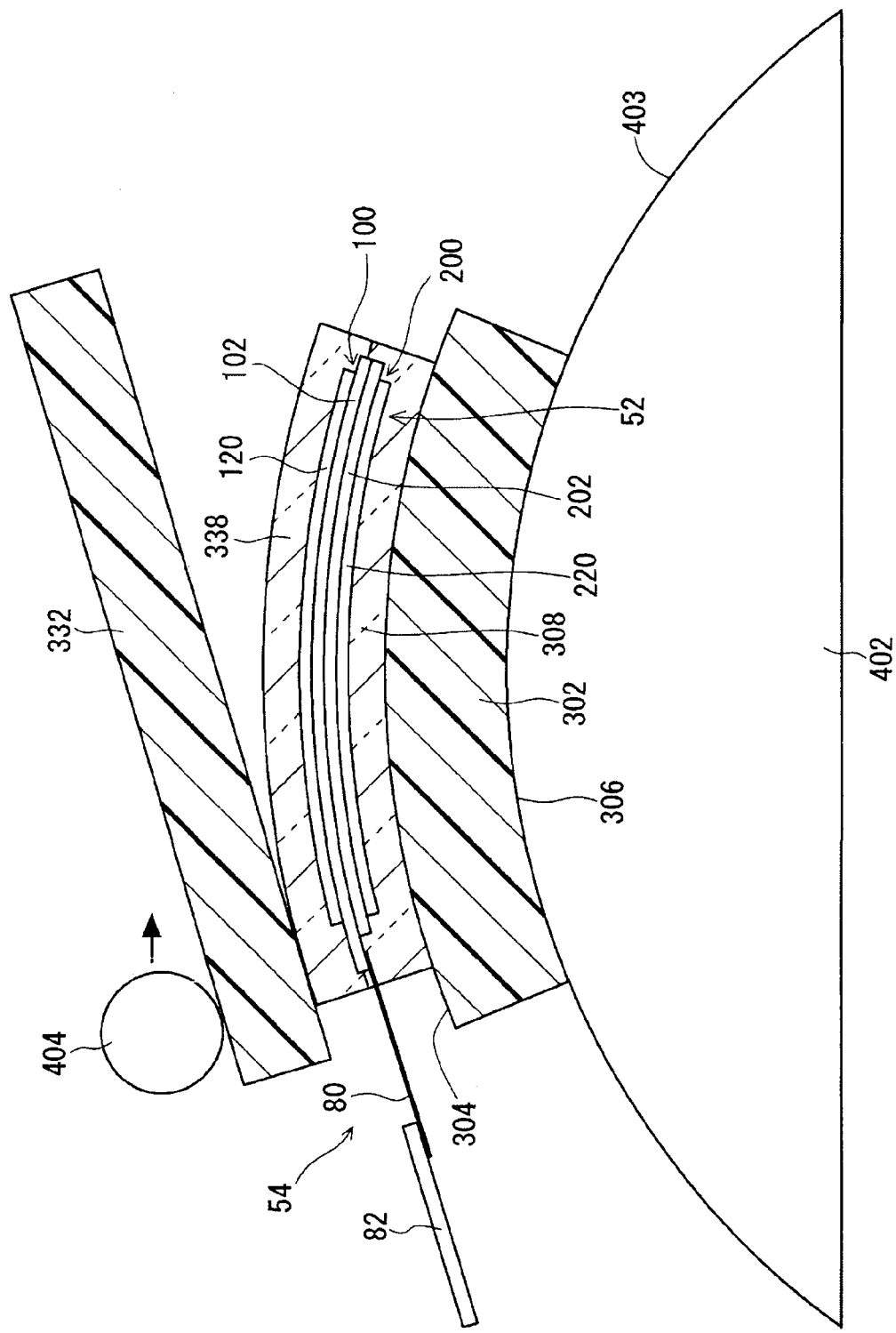
FIG. 31 is a sectional view explaining the manufacturing process for the display device according to Embodiment 3.

Next, as shown in FIG. 31, the supporting substrate 332 in the plate state is placed on the adhesive layer 338, and pressurized with the roller 404, to bond the supporting substrate 332 to the adhesive layer 338. This brings the supporting substrate 332 into the state of being curved along the curved liquid crystal panel 52, namely along the convex surface 304 of the supporting substrate 302, as shown in FIG. 32.

Although the bonding by roller system has been herein exemplified, the supporting substrate 332 may be bonded by vacuum crimping system, or the like.

Figure 32:
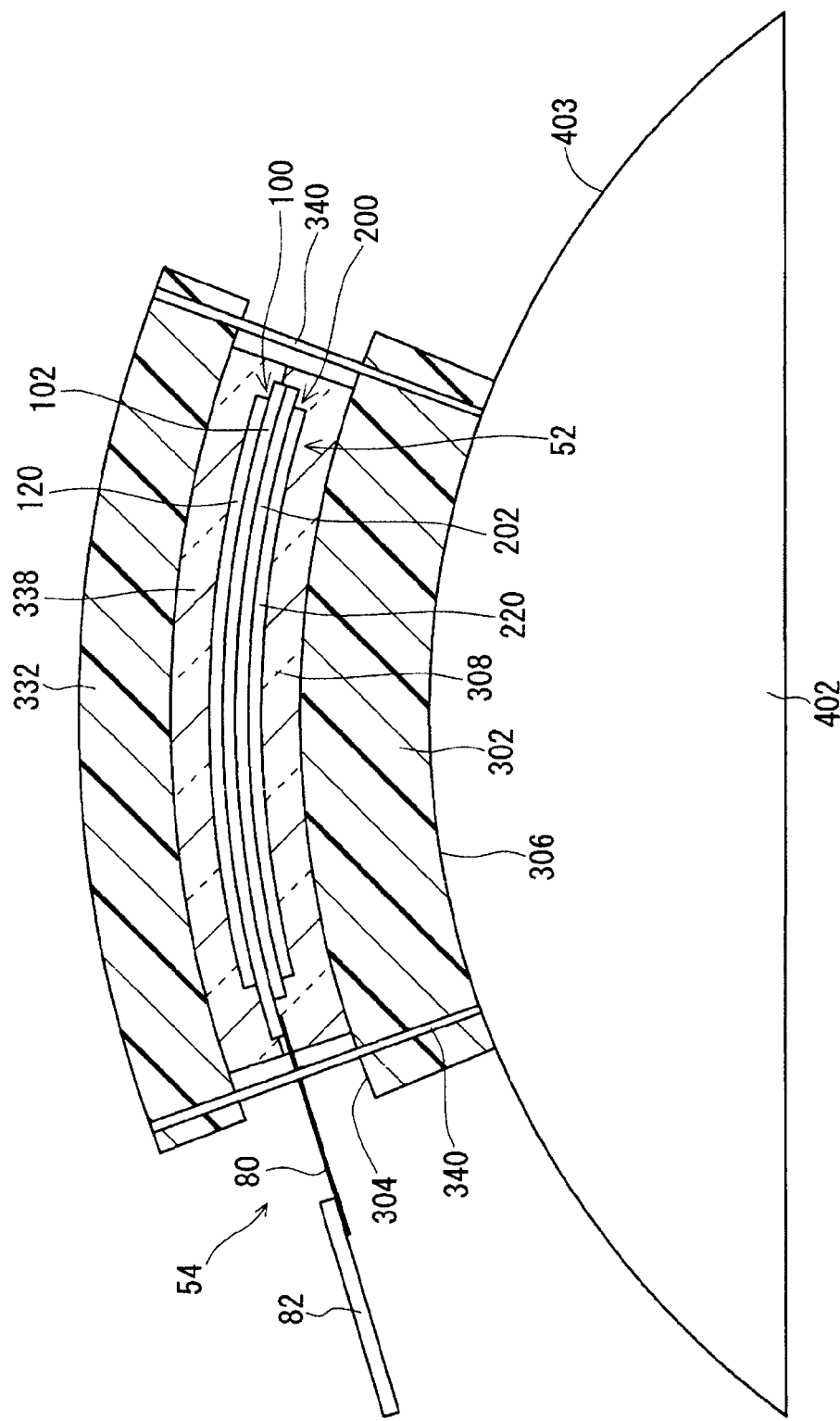
FIG. 32 is a sectional view explaining the manufacturing process for the display device according to Embodiment 3.

Subsequently, the supporting substrates 332, 302 are fixed with the screws 340 as shown in FIG. 32. Such fixation allows reliable retainment of the curved state of the supporting substrate 332. Further, with such fixation, the liquid crystal panel 52 is sandwiched between the supporting substrates 302, 332, and pressed into the curved form.

Then, the diffusion sheet 310 and the back light module 312 are stacked in this order on the supporting substrate 332 and fixed thereto. In the subsequent steps, for example, the manufacturing method exemplified in Embodiment 1 can be adopted.

According to the liquid crystal display device 50C, an effect similar to those of the liquid crystal display devices 50, 50B can be obtained, while a variety of effects can be obtained based on differences from the liquid crystal display devices 50, 50B.

For example, the adhesive layer 338 avoids direct contact between the liquid crystal panel 52 and the supporting substrate 332, while conducting bonding and fixation of both 52, 332. This can prevent collision of the supporting substrate 332 with the liquid crystal panel 52 due, for example, to vibrations of some sort to cause damage on the liquid crystal panel 52. It is therefore possible to promote improvement in protectivity, durability and the like, namely improvement in reliability.

Further, since having flexibility, the adhesive layer 338 acts as a buffer layer against a shock and a vibration. This can make protectivity, durability and the like high, as compared with the structure as in the above display device 500 for comparison (cf. FIG. 18) where the adhesive 504 between the liquid crystal panel 52 and the plate member 502 is cured.

Further, in the display device 500 where the adhesive 504 is cured, the cured adhesive 504 makes a tensile force generated between the liquid crystal panel 52 and the plate member 502 when the liquid crystal panel 52 is curved. On the other hand, according to the adhesive layer 338 with flexibility, such a force can be absorbed. This allows further suppression of the stress concentration in the liquid crystal panel 52. It is therefore possible to promote further improvement in mechanical strength, reliability and the like, and further improvement in display quality.

Moreover, adopting the adhesive layer 338 with flexibility brings the liquid crystal panel 52 into the state of being buried into the layer made up of the two adhesive layers 308, 338. This can reliably prevent peeling of the liquid crystal panel 52. Further, buffer properties, protectivity, durability and the like improve. It is thereby possible to obtain higher reliability.

It is to be noted that in the liquid crystal display device 50C, the diffusion sheet 310 is arranged between the back light module 312 and the supporting substrate 332. Even with such an arrangement form, the forgoing effect due to the diffusion sheet 310 can be obtained. That is, direct contact between the back light module 312 and the supporting substrate 332 is avoided, thereby to allow prevention of damage on both 312, 332. Further, even when a nonuniform void is generated between the back light module 312 and the supporting substrate 332, it is possible to suppress an interference fringe caused by such a void.

Embodiment 4

In above Embodiments 1 to 3, the structure is exemplified where the display surface of the liquid crystal panel 52, namely the display surface of each of the liquid crystal display devices 50, 50B, 50C, is curved in the concave form (cf. FIG. 2). In Embodiment 4 and later-mentioned Embodiments 5 and 6, a structure is exemplified where the display surface of the liquid crystal panel 52 is curved in a convex form.

Figure 33:
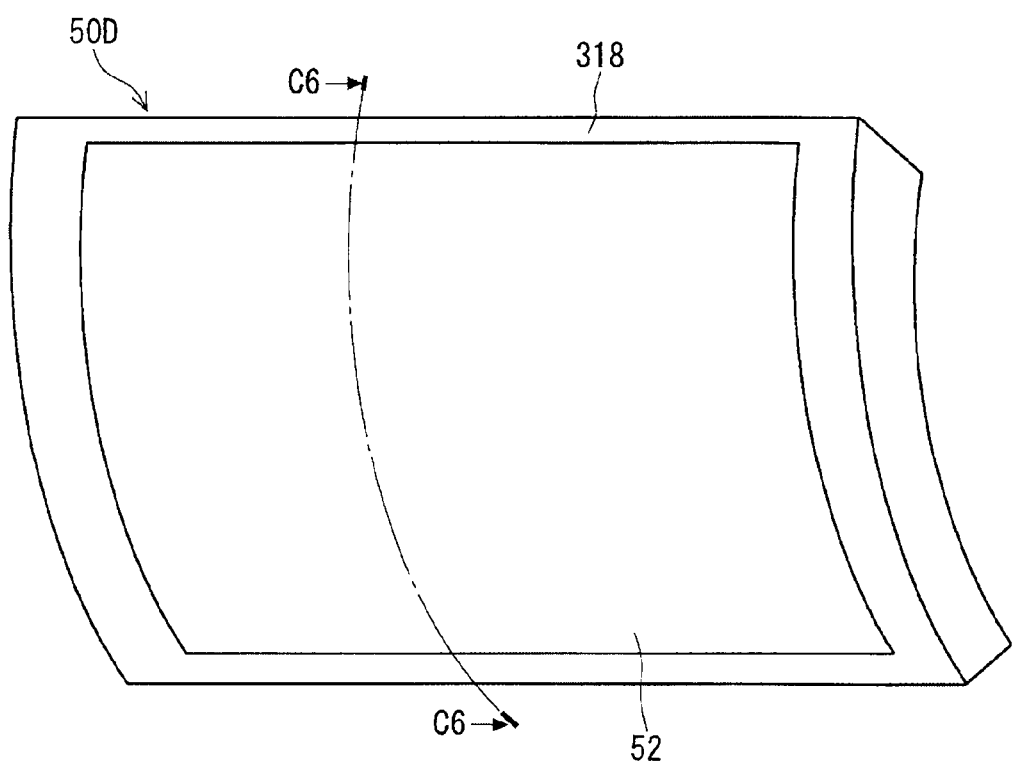
FIG. 33 is a perspective view explaining a display device according to Embodiment 4.

FIG. 33 exemplifies a liquid crystal display device 50D as an example of a display device according to Embodiment 4 of the present invention. Further, FIG. 34 shows a schematic sectional view along a line C6-C6 in FIG. 33.

Figure 34:
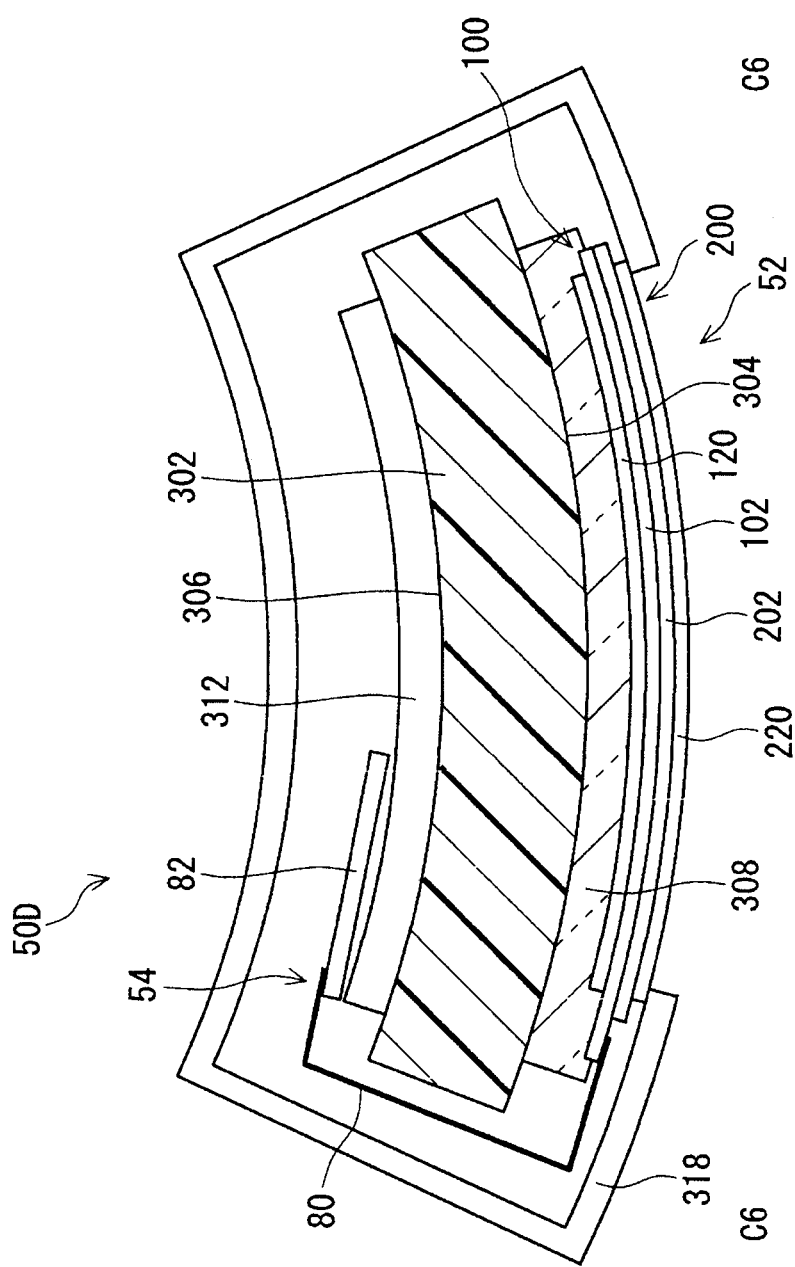
FIG. 34 is a sectional view along a line C6-C6 in FIG. 33.

As shown in FIG. 34, the liquid crystal display device 50D includes the adhesive layer 308, the supporting substrate 302 and the back light module 312 on the rear surface side of the liquid crystal panel 52 of the body module 54, herein on the array substrate 100 side. More specifically, the adhesive layer 308, the supporting substrate 302 and the back light module 312 are stacked in this order on the polarization plate 120 of the array substrate 100.

The supporting substrate 302 is provided with the convex surface 304 opposed to the liquid crystal panel 52, and bonded with the liquid crystal panel 52 by the adhesive layer 308. Thereby, the liquid crystal panel 52 is arranged in a state where the color filter substrate 200 constituting the display surface is curved in the convex form.

It is to be noted that, although the diffusion sheet 310 (cf. FIG. 3) is herein not included in the exemplified liquid crystal display device 50D, the diffusion sheet 310 can be added for example between the supporting substrate 302 and the back light module 312.

The other configurations of the liquid crystal display device 50D are basically similar to those of the above liquid crystal display device 50 (cf. FIG. 3).

The liquid crystal display device 50D can be manufactured for example through use of the manufacturing method exemplified in Embodiment 1. In this case, in the bonding step for the liquid crystal panel 52, the liquid crystal panel 52 may be placed on the adhesive layer 308 with the array substrate 100 opposed to the adhesive layer 308. Further, in the arrangement step for the back light module 312, the back light module 312 may be arranged on the concave surface 306 of the supporting substrate 302.

According to the liquid crystal display device 50D, an effect similar to that of the liquid crystal display device 50 can be obtained.

Embodiment 5

Figure 35:
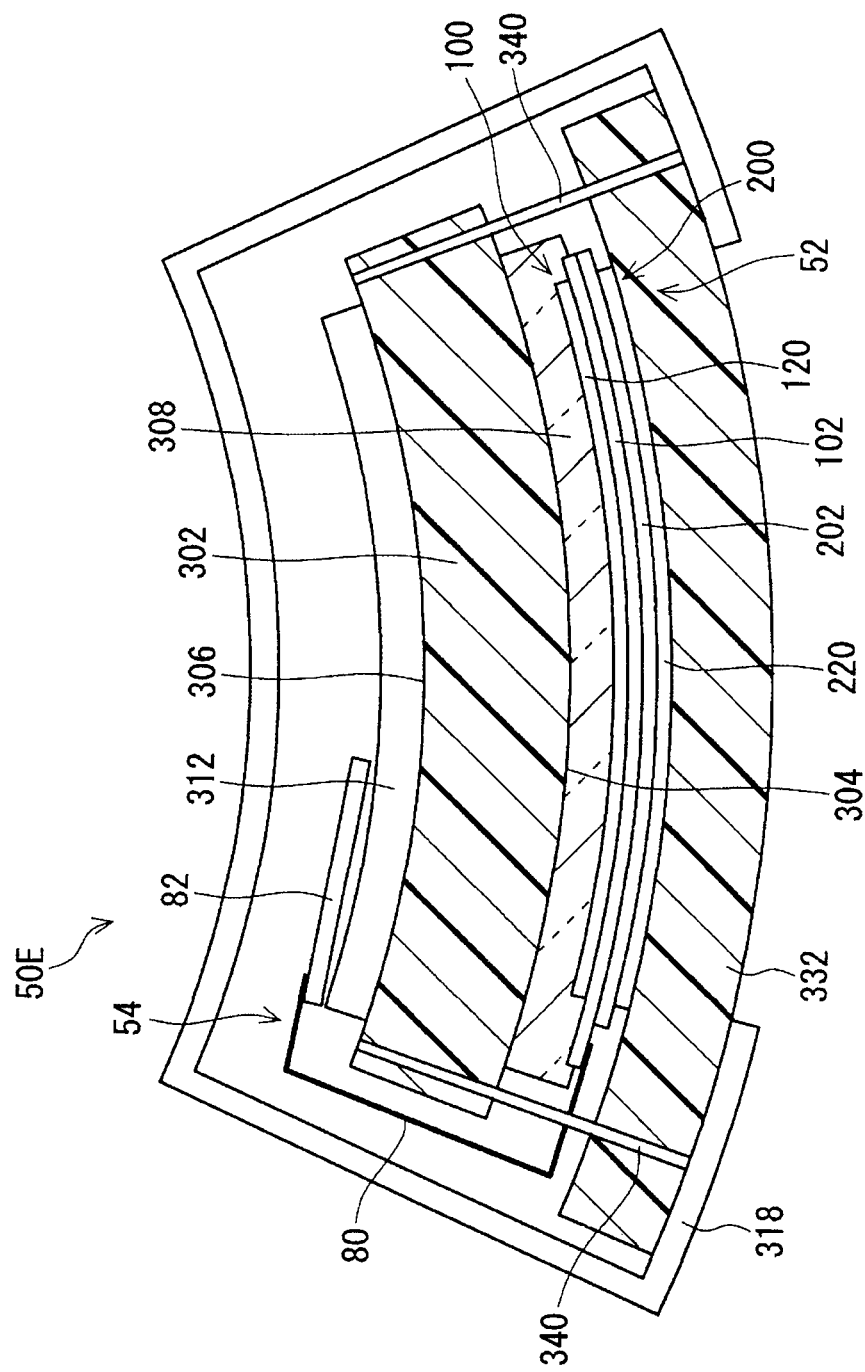
FIG. 35 is a sectional view explaining a display device according to Embodiment 5.

FIG. 35 exemplifies a liquid crystal display device 50E as an example of a display device according to Embodiment 5 of the present invention. FIG. 35 is a sectional view corresponding to FIG. 34.

The liquid crystal display device 50E has a configuration of the liquid crystal display device 50D (cf. FIG. 34) according to Embodiment 4 added with the supporting substrate 332 and the screws 340. It is to be noted that FIG. 35 schematically illustrates the screws 340.

The supporting substrate 332 is arranged on the polarization plate 220 of the color filter substrate 200, and fixed to the supporting substrate 302 on the array substrate 100 side with the screws 340.

In the liquid crystal display device 50E, the supporting substrate 302 located on the rear surface side of the liquid crystal panel 52 is small as compared with the supporting substrate 332 located on the display surface side of the liquid crystal panel 52.

The other configurations of the liquid crystal display device 50E are basically similar to those of the above liquid crystal display device 50D, 50B (cf. FIGS. 34 and 26).

The liquid crystal display device 50E can be manufactured for example by adding the arrangement step and the fixation step for the supporting substrate 332 exemplified in Embodiment 2 to the manufacturing method exemplified in Embodiment 4.

According to the liquid crystal display device 50E, an effect similar to that of the liquid crystal display device 50B can be obtained.

Embodiment 6

Figure 36:
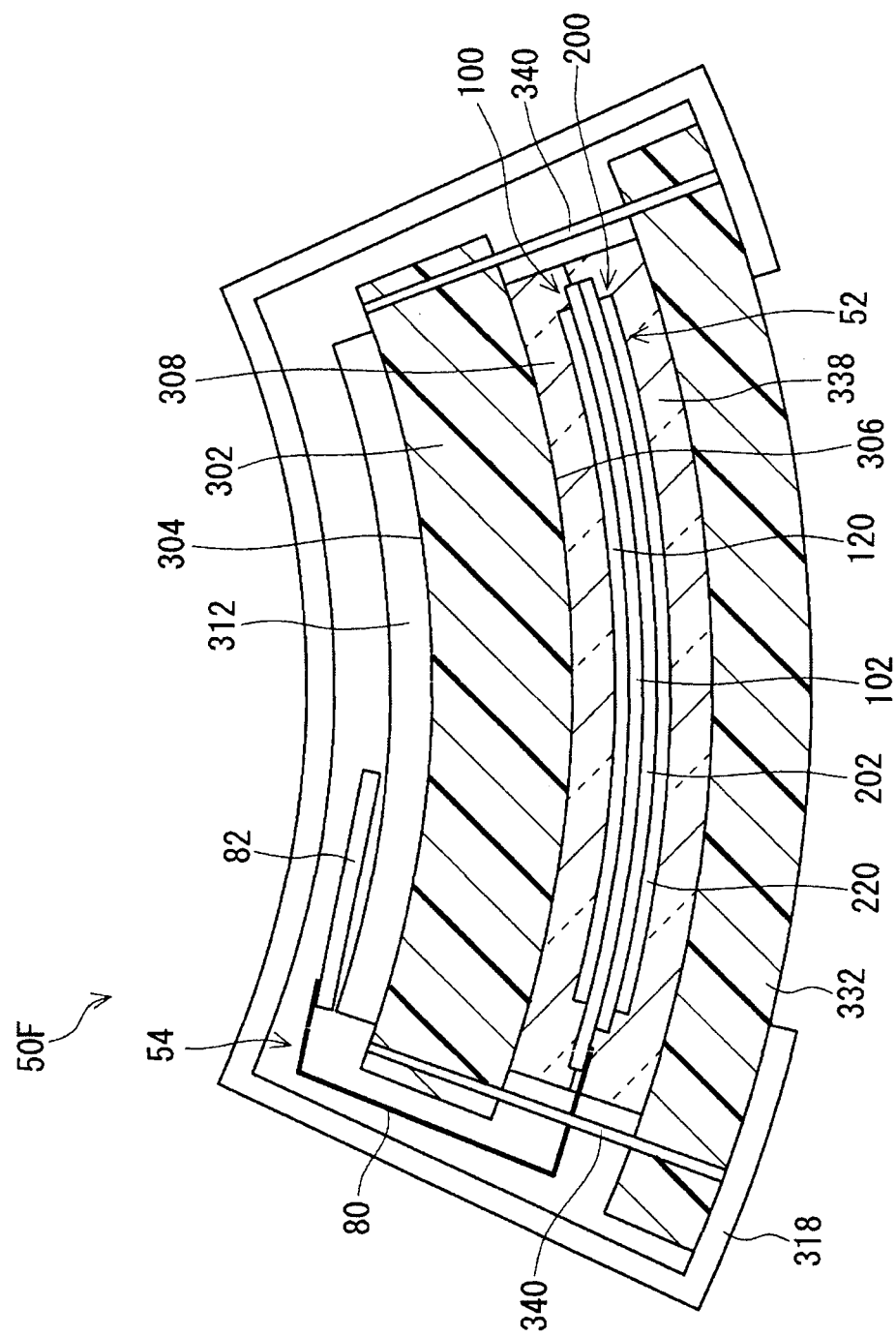
FIG. 36 is a sectional view explaining a display device according to Embodiment 6.

FIG. 36 exemplifies a liquid crystal display device 50F as an example of a display device according to Embodiment 6 of the present invention. FIG. 36 is a sectional view corresponding to FIGS. 34 and 35.

The liquid crystal display device 50F has a configuration of the liquid crystal display device 50E (cf. FIG. 35) according to Embodiment 5 added with an adhesive layer 338.

The adhesive layer 338 is provided between the liquid crystal panel 52 and the supporting substrate 332, and bonds the liquid crystal panel 52 and the supporting substrate 332 to each other. Further, in the illustrated example, the liquid crystal panel 52 is buried in the layer made up of the adhesive layers 338, 308 in a similar manner to the liquid crystal display device 50C (cf. FIG. 29) according to Embodiment 3.

The other configurations of the liquid crystal display device 50F are basically similar to those of the above liquid crystal display devices 50E, 50C (cf. FIGS. 35 and 29).

The liquid crystal display device 50F can be manufactured for example by adding the bonding step for the adhesive layer 338 exemplified in Embodiment 3 to the manufacturing method exemplified in Embodiment 5.

According to the liquid crystal display device 50F, an effect similar to that of the liquid crystal display device 50C can be obtained.

Embodiment 7

In above Embodiments 1 to 6, the structure is exemplified where the liquid crystal panel 52 is arranged on the convex surface 304 side of the supporting substrate 302, that is, the supporting substrate 302 is located on the concave side of the liquid crystal panel 52 in the curved state (cf. FIGS. 3, 26, 29, 34 to 36). In Embodiment 7 and later-mentioned Embodiments 8, 9, a structure is exemplified where the liquid crystal panel 52 is arranged on the concave surface 306 side of the supporting substrate 302, that is, the supporting substrate 302 is located on the convex side of the liquid crystal panel 52 in the curved state.

Figure 37:
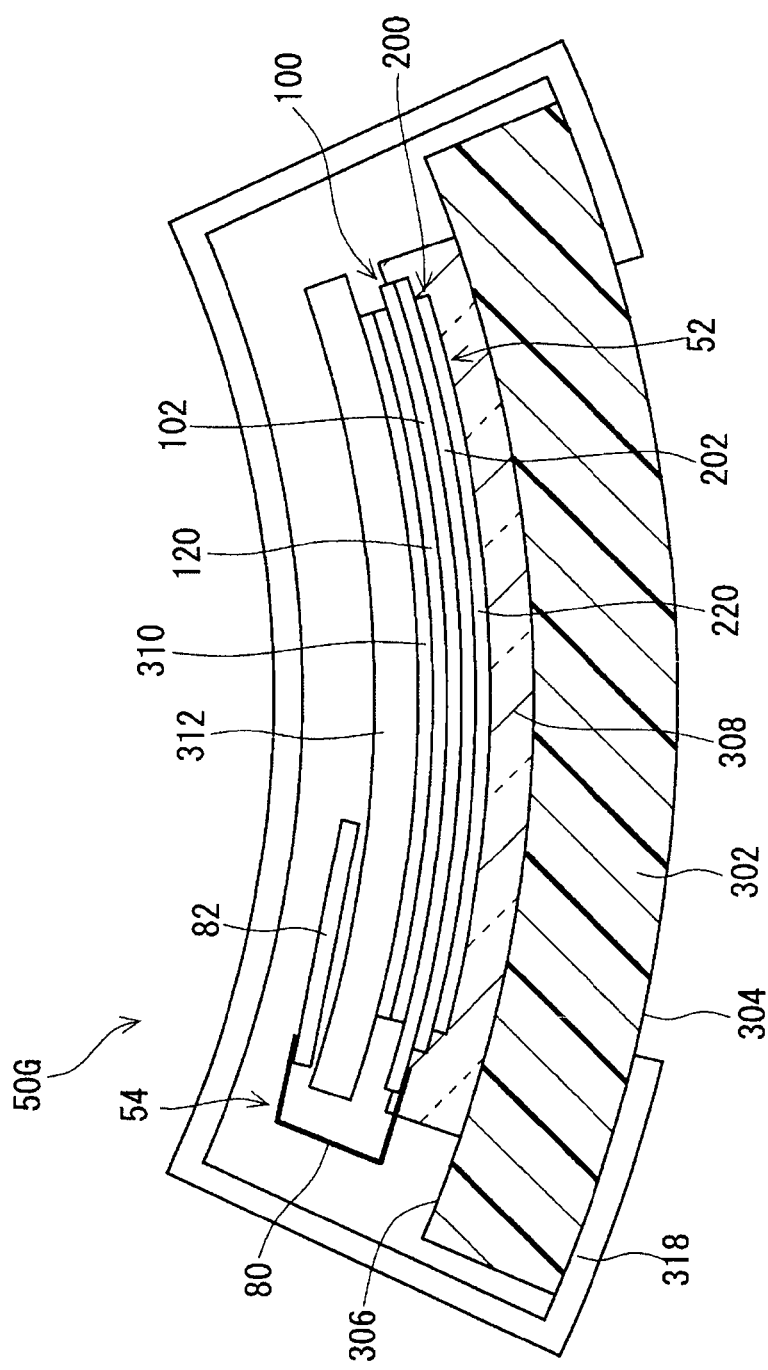
FIG. 37 is a sectional view explaining a display device according to Embodiment 7.

FIG. 37 exemplifies a liquid crystal display device 50G as an example of a display device according to Embodiment 7 of the present invention.

In the liquid crystal display device 50G, the adhesive layer 308, the liquid crystal panel 52, the diffusion sheet 310 and the back light module 312 are stacked in this order on the concave surface 306 of the supporting substrate 302. The liquid crystal panel 52 is bonded to the concave surface 306 of the supporting substrate 302 by the adhesive layer 308. Thereby, the liquid crystal panel 52 is arranged in a state where the color filter substrate 200 constituting the display surface is curved in the convex form.

The other configurations of the liquid crystal display device 50G are basically similar to those of the above liquid crystal display device 50 (cf. FIG. 3).

Figure 38:
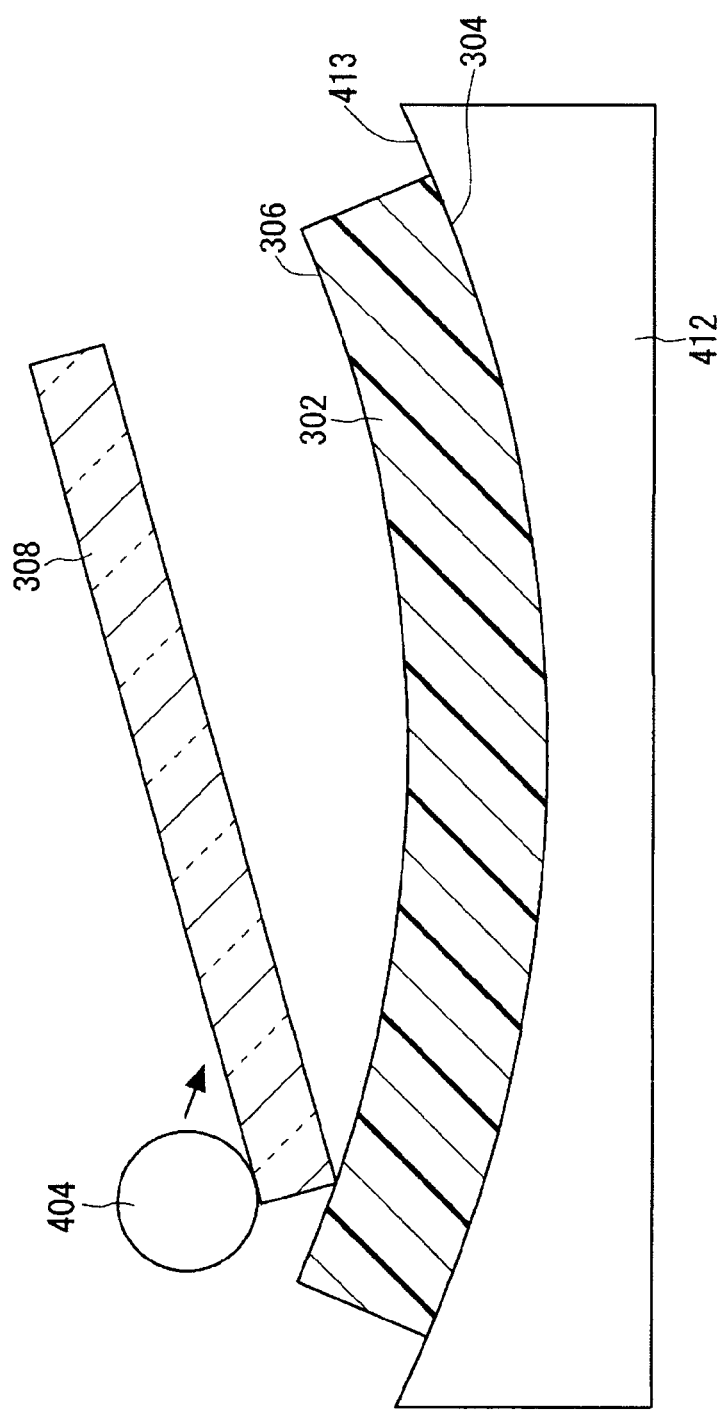
FIG. 38 is a sectional view explaining a manufacturing process for the display device according to Embodiment 7.

The liquid crystal display device 50G can be manufactured for example through use of the manufacturing method exemplified in Embodiment 1. In this case, as shown in FIG. 38, it is convenient to use a workbench 412 having a concave surface 413 formed in the same curved form as the curved surfaces 304, 306 of the supporting substrate 302. More specifically, it is preferable to place the supporting substrate 302 on the workbench 412 in a state where the convex surface 304 of the supporting substrate 302 is turned to a concave surface 413 of the workbench 412 and the curved forms of both curved surfaces 304, 413 are matched with each other.

According to the liquid crystal display device 50G, an effect similar to that of the liquid crystal display device 50 can be obtained.

Embodiment 8

Figure 39:
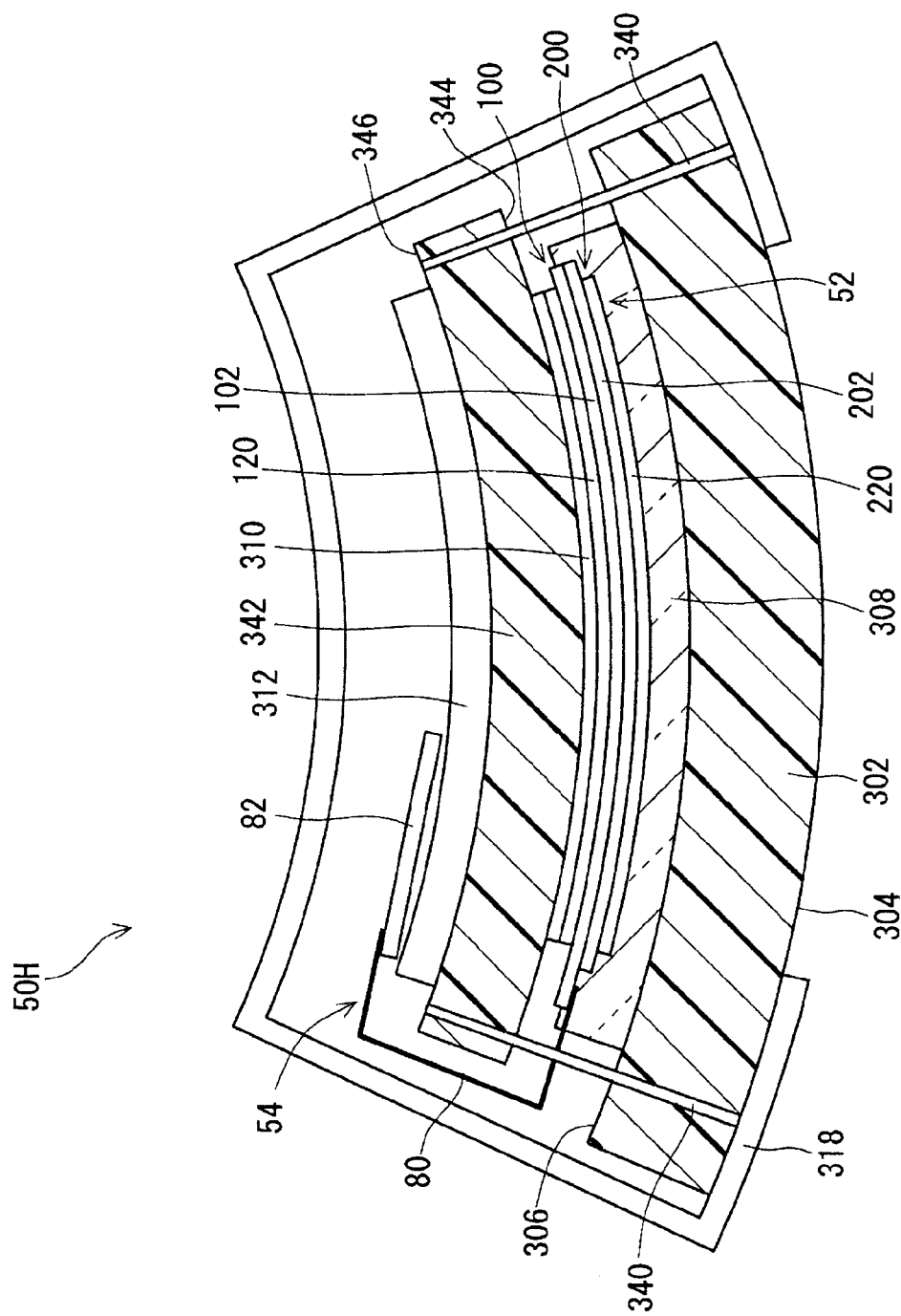
FIG. 39 is a sectional view explaining a display device according to Embodiment 8.

FIG. 39 exemplifies a liquid crystal display device 50H as an example of a display device according to Embodiment 8 of the present invention.

The liquid crystal display device 50H has a configuration of the liquid crystal display device 50G (cf. FIG. 37) according to Embodiment 7 added with a supporting substrate 342 and the screws 340. It is to be noted that FIG. 39 schematically illustrates the screws 340.

More specifically, in the liquid crystal display device 50H, the adhesive layer 308, the liquid crystal panel 52, the diffusion sheet 310, the supporting substrate 342 and the back light module 312 are stacked in this order on the concave surface 306 of the supporting substrate 302. The supporting substrate 342 is fixed to the supporting substrate 302 with the screws 340. The liquid crystal panel 52 is bonded to the concave surface 306 of the supporting substrate 302 by the adhesive layer 308. Thereby, the liquid crystal panel 52 is arranged in a state where the color filter substrate 200 constituting the display surface is curved in the convex form.

In the illustrated example, the supporting substrate 342 is made up of a plate-like member whose opposed main surfaces 344, 346 are curved, and one curved surface 344 constitutes a convex surface of the supporting substrate 342 while the other curved surface 346 constitutes a concave surface of the supporting substrate 342. It should be noted that in this case, a center of curvature of each of the curved surfaces 344, 346 is located on the concave surface 346 side.

The curved surfaces 344, 346 have the same curved forms as those of the curved surfaces 304, 306 of the supporting substrate 302. Further, a case is exemplified where a distance between the curved surfaces 344 and 346 is uniform, that is a thickness of the plate-like member constituting a supporting member 342 is wholly uniform. In this case, the curved surfaces 344, 346 are in the relation of overlapping with each other by parallel movement.

The supporting substrate 342 is already curved before the arrangement step for the substrate 342, and previously has a convex surface 344 and a concave surface 346. The curved form of the supporting substrate 342 can be formed for example by a technique such as bending process for a plate-like member, cutting and grinding process or injection molding.

Similarly to the supporting substrate 302, the supporting substrate 342 has higher stiffness than the liquid crystal panel 52, and is configured so as to be difficult to transform as compared with the liquid crystal panel 52. Similarly to the supporting substrate 302, the supporting substrate 342 can, for example, be made up of an acrylic substrate or a polycarbonate substrate having a thickness of not smaller than 3.0 mm.

In the liquid crystal display device 50H, the supporting substrate 342 is arranged with the convex surface 344 opposed to the liquid crystal panel 52. More specifically, the supporting substrate 342 is arranged in an orientation where the convex surface 344 of the substrate 342 and the concave surface 306 of the supporting substrate 302 match with each other. Thereby the liquid crystal panel 52 is sandwiched between the convex surface 344 of the supporting substrate 342 and the concave surface 306 of the supporting substrate 302, and pressed into the curved form.

The supporting substrate 342 is made up of a transparent material so as to allow passage of emitted light from the back light module 312 to the liquid crystal panel 52 side. The transparent supporting substrate 342 can be made up of an acrylic or polycarbonate resin as exemplified above.

In view of the above, the supporting substrate 342 can, for example, be configured in a similar manner to the supporting substrate 302.

It should be noted that in the liquid crystal display device 50H, the supporting substrate 342 located on the rear surface side of the liquid crystal panel 52 is small as compared with the supporting substrate 302 located on the display surface side of the liquid crystal panel 52.

The other configurations of the liquid crystal display device 50H are basically similar to those of the above liquid crystal display devices 50G, 50B (cf. FIGS. 37, 26).

The liquid crystal display device 50H can be manufactured for example by adding the arrangement step and the fixation step for the supporting substrate 342 to the manufacturing method exemplified in Embodiment 7. The arrangement step and the fixation step for the supporting substrate 342 can, for example, be performed in similar manner to the arrangement step and the fixation step for the supporting substrate 332 exemplified in Embodiment 2.

According to the liquid crystal display device 50H, an effect similar to that of the liquid crystal display device 50B can be obtained.

Embodiment 9

Figure 40:
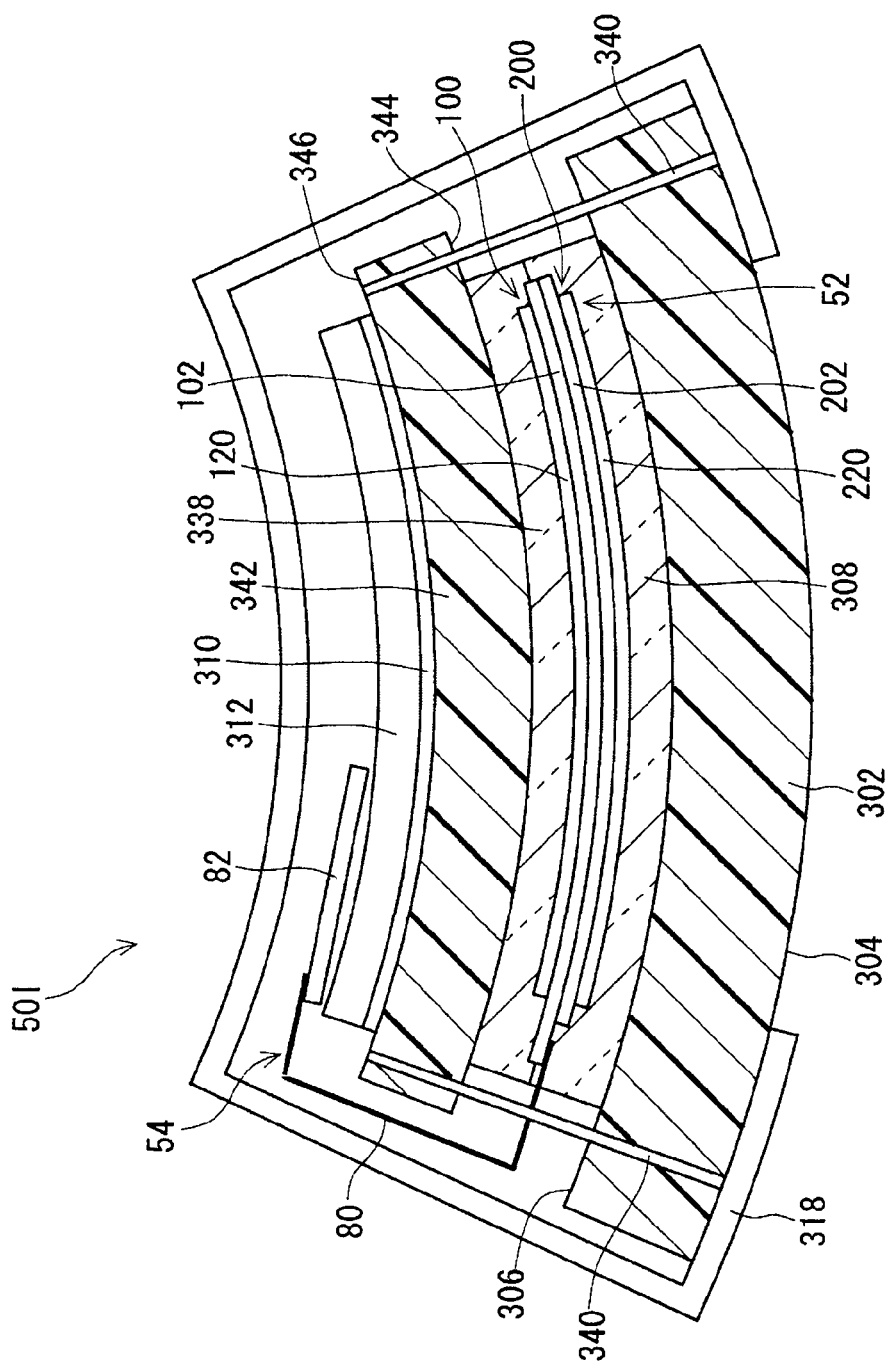
FIG. 40 is a sectional view explaining a display device according to Embodiment 9.

FIG. 40 exemplifies a liquid crystal display device 50I as an example of a display device according to Embodiment 9 of the present invention.

The liquid crystal display device 50I has a configuration of the liquid crystal display device 50H (cf. FIG. 39) according to Embodiment 8 added with the adhesive layer 338.

The adhesive layer 338 is provided between the liquid crystal panel 52 and the supporting substrate 342, and bonds the liquid crystal panel 52 and the supporting substrate 342 to each other. Further, in the illustrated example, the liquid crystal panel 52 is buried in the adhesive layers 338, 302 in a similar manner to the liquid crystal display devices 50C, 50F (cf. FIGS. 29 and 36) according to Embodiments 3 and 6.

The other configurations of the liquid crystal display device 50I are basically similar to those of the above liquid crystal display devices 50H, 50C (cf. FIGS. 39 and 29).

The liquid crystal display device 50I can be manufactured for example by adding the bonding step for the adhesive layer 338 exemplified in Embodiment 3 to the manufacturing method exemplified in Embodiment 8.

According to the liquid crystal display device 50I, an effect similar to that of the liquid crystal display device 50C can be obtained.

Modified Example of FIGS. 1 to 9

In Embodiments 1 to 9, the case has been exemplified where the color filter substrate 200 side constitutes the display surface. As opposed to this, the array substrate 100 side can also be made to serve as the display surface. For example, in the liquid crystal display device 50 (cf. FIG. 3), arranging the liquid crystal panel 52 with the array substrate 100 turned to the supporting substrate 302 side can make the array substrate 100 side serve as the display surface. Further, in the liquid crystal display device 50B and the like, arranging the liquid crystal panel 52 outside in can make the array substrate 100 side serve as the display surface.

Moreover, the above variety of structures are applicable to a reflective type liquid crystal display device. In this case, out of the insulating substrates 102, 202, a substrate not constituting the display surface, namely a substrate to serve as the rear surface side, may not be transparent. This respect also applies to the supporting substrates 302, 332, 342.

Further, although the liquid crystal display device has been exemplified above, the above variety of structures are applicable to a display device having a display panel other than the liquid crystal panel. Examples of the other display panel include an electronic paper panel and an electroluminescence-type electroluminescence panel.

DESCRIPTION OF REFERENCE SIGNS 50, 50B to 50I liquid crystal display device, 52 display panel, 302, 332, 342 supporting substrate, 304 convex surface (curved surface), 306 concave surface (curved surface), 308, 338 adhesive layer, 310 diffusion sheet, 312 back light module, 340 screw (fixing means)

The invention claimed is:
1. A display device comprising:
   a display panel having a display surface and a back surface opposite to said display surface, both of said display surface and said back surface being made up of a solid, said display panel having a visible characteristic that is changed by an electrical input;
   an adhesive layer provided on one of said display surface and said back surface of said display panel and bonded to said one surface; and
   a supporting substrate, which is made up of a member previously provided with curved surfaces, and onto said curved surface of which said display panel is bonded by said adhesive layer, to support said display panel in a curved form along said curved surface,
   wherein said adhesive layer is present in an extended manner beyond said display panel all around said display panel, and a part of an end surface surrounding all circumferences of said display panel is covered with said adhesive layer.

2. The display device according to claim 1, wherein said supporting substrate has higher stiffness than said display panel.

3. The display device according to claim 1, wherein said adhesive layer has flexibility.

4. The display device according to claim 1, wherein said adhesive layer is present in an extended manner between said display panel and said supporting substrate and is also present in an extended manner on end surfaces of said display panel.

5. The display device according to claim 1, further comprising:
   another supporting substrate arranged as opposed to said supporting substrate via said display panel; and
   fixing means which fixes said supporting substrate and said another supporting substrate in the state of sandwiching and retaining said display panel therebetween.

6. The display device according to claim 5, further comprising:
   another adhesive layer which is provided between said another supporting substrate and said display panel and bonds said another supporting substrate and said display panel to each other.

7. The display device according to claim 6, wherein said another adhesive layer has flexibility.

8. The display device according to claim 7, wherein said display panel is buried in a layer made up of said adhesive layer and said another adhesive layer.

9. The display device according to claim 1, further comprising:
   a back light module provided on a rear surface side of said display panel; and
   a diffusion sheet provided between said back light module and said display panel.

10. The display device according to claim 9, wherein said back light module has a form along said curved form of said display panel.

11. The display device according to claim 1, wherein
   said supporting substrate has a larger thickness than said display panel, and
   said adhesive layer has a larger thickness than said display panel and a smaller thickness than said supporting substrate.

12. The display device according to claim 5, wherein said another supporting substrate has a larger thickness than said display panel and a smaller thickness than said supporting substrate.

13. The display device according to claim 5, wherein, of said supporting substrate and said another supporting substrate, the one of said substrates located on the rear surface side of said display panel is smaller than the other of said substrates located on a display surface side of said display panel.

14. The display device according to claim 1, wherein said supporting substrate is provided on a concave side of said display panel in said curved form.

15. The display device according to claim 1, wherein said display panel is made up of any one of a liquid crystal panel, an electronic paper panel and an electroluminescence panel.

16. The display device according to claim 2, wherein the supporting substrate has a larger thickness than the display panel.

* * * * *